(12) United States Patent  
Miyao et al.

(10) Patent No.: US 8,811,436 B2  
(45) Date of Patent: Aug. 19, 2014

(54) LASER APPARATUS, EXTREME ULTRAVIOLET LIGHT GENERATION SYSTEM INCLUDING THE LASER APPARATUS, AND METHOD FOR CONTROLLING THE LASER APPARATUS

(75) Inventors: Kenichi Miyao, Oyama (JP); Motoki Niwano, Oyama (JP); Osamu Wakabayashi, Hiratsuka (JP)

(73) Assignee: Gigaphoton Inc, Tochigi (JP)

( * ) Notice: Subject to any disclaimer, the term of this patent is extended or adjusted under 35 U.S.C. 154(b) by 8 days.

(21) Appl. No.: 13/696,497

(22) PCT Filed: Feb. 8, 2012

(86) PCT No.: PCT/IB2012/000222  
§ 371 (c)(1),  
(2), (4) Date: Nov. 6, 2012

(87) PCT Pub. No.: WO2012/114172  
PCT Pub. Date: Aug. 30, 2012

(65) Prior Publication Data  
US 2013/0051412 A1    Feb. 28, 2013

(30) Foreign Application Priority Data

Feb. 25, 2011 (JP) ................... 2011-040909  
Dec. 19, 2011 (JP) ................... 2011-277208

(51) Int. Cl.  
*H01S 3/13* (2006.01)

(52) U.S. Cl.  
USPC ............ 372/29.011; 372/29.012; 372/29.015; 372/30; 372/31; 372/32

(58) Field of Classification Search  
USPC ............... 372/29.011, 29.012, 29.015, 30, 31  
See application file for complete search history.

(56) References Cited

U.S. PATENT DOCUMENTS

| | | | |
|---|---|---|---|
| 5,369,655 A | 11/1994 | Miyamoto et al. | |
| 6,421,363 B1 | 7/2002 | Osinski et al. | |
| 2004/0105479 A1 | 6/2004 | Klene et al. | |
| 2005/0002425 A1 | 1/2005 | Govorkov et al. | |
| 2005/0254531 A1 | 11/2005 | Furukawa et al. | |
| 2007/0001131 A1 | 1/2007 | Ershov et al. | |
| 2008/0149862 A1 | 6/2008 | Hansson et al. | |
| 2009/0232171 A1* | 9/2009 | Abe et al. ................. | 372/25 |
| 2010/0220756 A1 | 9/2010 | Krzysztof et al. | |
| 2013/0032735 A1* | 2/2013 | Nowak et al. ............. | 250/504 R |

FOREIGN PATENT DOCUMENTS

JP          63-092073 A       4/1988

OTHER PUBLICATIONS

International Search Report mailed Jul. 3, 2012 issued in corresponding International Application No. PCT/IB2012/000222.

* cited by examiner

*Primary Examiner* — Dung Nguyen  
(74) *Attorney, Agent, or Firm* — McDermott Will & Emery LLP

(57) ABSTRACT

A laser apparatus may include a master oscillator configured to output a laser beam, at least one amplifier disposed in a beam path of the laser beam from the master oscillator, at least one power source for applying a high-frequency voltage to the at least one amplifier, and a controller for varying the high-frequency voltage to be applied to the at least one amplifier from the at least one power source.

16 Claims, 25 Drawing Sheets

LASER APPARATUS, EXTREME ULTRAVIOLET LIGHT GENERATION SYSTEM INCLUDING THE LASER APPARATUS, AND METHOD FOR CONTROLLING THE LASER APPARATUS

CROSS-REFERENCE TO RELATED APPLICATIONS

The present application is the U.S. National Phase under 35 U.S.C. §371 of International Application No. PCT/IB2012/000222, filed on Feb. 8, 2012, which in turn claims priority from Japanese Patent Application No. 2011-040909 filed Feb. 25, 2011, and Japanese Patent Application No. 2011-277208 filed Dec. 19, 2011.

BACKGROUND

1. Technical Field

This disclosure relates to a laser apparatus, an extreme ultraviolet (EUV) light generation system including the laser apparatus, and a method for controlling a laser apparatus.

2. Related Art

In recent years, semiconductor production processes have become capable of producing semiconductor devices with increasingly fine feature sizes, as photolithography has been making rapid progress toward finer fabrication. In the next generation of semiconductor production processes, microfabrication with feature sizes at 60 nm to 45 nm, and further, microfabrication with feature sizes of 32 nm or less will be required. In order to meet the demand for microfabrication at 32 nm or less, for example, an exposure apparatus is expected to be developed, in which an apparatus for generating extreme ultraviolet (EUV) light at a wavelength of approximately 13 nm is combined with a reduced projection reflective optical system.

Three kinds of systems for generating EUV light are generally known and include a Laser Produced Plasma (LPP) type system in which plasma is generated by irradiating a target material with a laser beam, a Discharge Produced Plasma (DPP) type system in which plasma is generated by electric discharge, and a Synchrotron Radiation (SR) type system in which orbital radiation is used.

SUMMARY

A laser apparatus according to one aspect of this disclosure may include: a master oscillator configured to output a laser beam; at least one amplifier disposed in a beam path of the laser beam from the master oscillator; at least one power source for applying a high-frequency voltage to the at least one amplifier; and a controller for varying the high-frequency voltage to be applied to the at least one amplifier from the at least one power source.

An extreme ultraviolet light generation system according to another aspect of this disclosure may include: the above described laser apparatus; a chamber; a target supply unit provided on or otherwise mounted to the chamber; and an extreme ultraviolet light generation controller configured to control the laser apparatus and the target supply unit.

A method according to yet another aspect of this disclosure for controlling a laser apparatus that includes a master oscillator, at least one amplifier, at least one power source, and a laser controller may include: outputting a pulsed laser beam continually at a predetermined repetition rate from the master oscillator; and varying a high-frequency voltage to be applied to the at least one amplifier from the at least one power source.

BRIEF DESCRIPTION OF THE DRAWINGS

Hereinafter, selected embodiments of this disclosure will be described with reference to the accompanying drawings.

DESCRIPTION OF PREFERRED EMBODIMENTS

Figure 1:
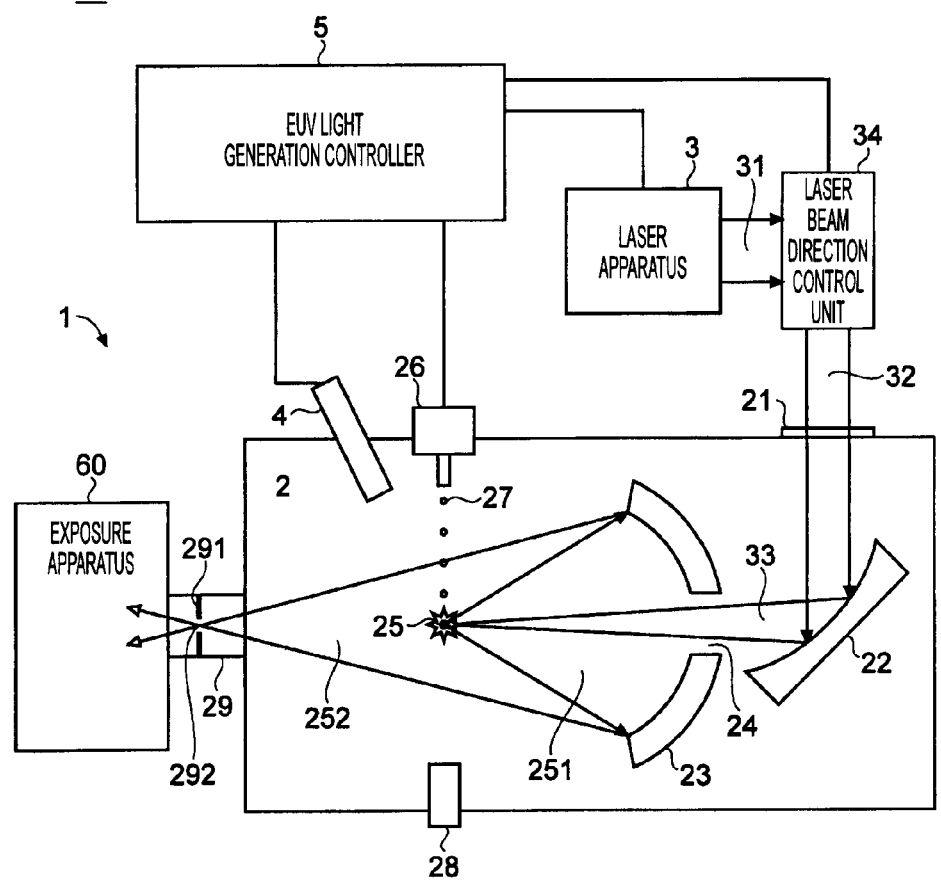
FIG. 1 schematically illustrates the configuration of an exemplary LPP type EUV light generation system.

Hereinafter, selected embodiments of this disclosure will be described in detail with reference to the accompanying drawings. The embodiments to be described below are merely illustrative in nature and do not limit the scope of this disclosure. Further, the configuration(s) and operation(s) described in each embodiment are not all essential in implementing this disclosure. It should be noted that like elements are referenced by like reference numerals, symbols, and/or characters, and duplicate descriptions thereof will be omitted herein. The embodiments of this disclosure will be illustrated following the table of contents below.

Contents
1. Overview
2. Terms
3. Overview of EUV Light Generation System
   3.1 Configuration
   3.2 Operation
   3.3 Burst Operation Mode
4. Control System of Laser Apparatus
   4.1 Configuration
   4.2 Operation
   4.3 Effect
   4.4 Variations
   4.5 Timing Charts
   4.6 Burst Operation Mode and Pulse Energy Characteristics
   4.7 Control Flow
5. Method for Controlling Excitation Intensity of Amplifier
   5.1 PWM Method
   5.2 Potential Control Method
   5.3 Combination of PWM Method and Potential Control Method
6. Laser Apparatus with Semiconductor Lasers for Master Oscillator
   6.1 Configuration
   6.2 Operation
   6.3 Effect
   6.4 Timing Chart
7. Extreme Ultraviolet Light Generation System Including Laser Apparatus
   7.1 Configuration
   7.2 Operation
   7.3 Effect
   7.4 Control Flow
      7.4.1 Burst Signal Generation Control Flow in EUV Light Generation Controller
      7.4.2 Trigger Signal Generation Control Flow in EUV Light Generation Controller
8. Supplementary Descriptions
   8.1 Configuration of Amplifiers with $CO_2$ Gas as Gain Medium
   8.2 Optical Shutters
      8.2.1 Combination of Pockels Cell and Polarizers
      8.2.2 Combination of Faraday Rotator and Polarizers
      8.2.3 Acousto-Optic Device
      8.2.4 Variations of Optical Shutters
         8.2.4.1 First Variation
         8.2.4.2 Second Variation
         8.2.4.3 Third Variation
         8.2.4.4 Fourth Variation
   8.3 Regenerative Amplifier 1. Overview An overview of the embodiments will be described below. A laser apparatus according to this embodiment may include a master oscillator, at least one amplifier, at least one optical shutter, at least one power source, and at least one optical shutter controller. The power source may control the excitation intensity to be applied to the amplifier. The optical shutter may be disposed in a beam path between the master oscillator and the at least one amplifier. The control device may control the at least one amplifier to a first predetermined excitation intensity prior to the burst generation.

2. Terms

Terms used in this application may be interpreted as follows. The term "droplet" may refer to one or more liquid droplet(s) of a molten target material. Accordingly, the shape of a droplet may be substantially spherical due to its surface tension. The term "plasma generation region" may refer to a three-dimensional space in which plasma is to be generated. The term "burst operation" may refer to an operation mode or state in which a pulsed laser beam or pulsed extreme ultraviolet (EUV) light is outputted at a predetermined repetition rate during a predetermined period and the pulsed laser beam or the pulsed EUV light is not outputted outside of the predetermined period. The term "strong excitation" may be defined as excitation intensity of an amplifier while a pulsed laser beam or pulsed EUV light is being outputted during the burst operation. The term "weak excitation" may be defined as excitation intensity of an amplifier while the amplifier is being operated at an energy level (voltage, current, or power amount) lower than that of the strong excitation. In a beam path of a laser beam, a direction or side closer to the laser apparatus is referred to as "upstream," and a direction or side closer to the plasma generation region is referred to as "downstream." The term "predetermined repetition rate" does not have to be a constant repetition rate but may be a substantially constant repetition rate.

In this disclosure, the Z-direction may be defined as a direction into which a pulsed laser beam travels. The X-direction may be perpendicular to the Z-direction, and the Y-direction may be perpendicular to both the Z-direction and the X-direction. Accordingly, the X-direction and the Y-direction may be rotated as the direction into which the pulsed laser beam travels is changed. For example, when the direction into which the pulsed laser beam travels (Z-direction) changes within X-Z plane, the X-direction may be rotated in accordance with the change in the Z-direction, but the Y-direction may remain unchanged. Similarly, when the direction into which the pulsed laser beam travels (Z-direction) changes within Y-Z plane, the Y-direction may be rotated in accordance with the change in the Z-direction, but the X-direction may remain unchanged. In order to facilitate understanding, the coordinate systems for the pulsed laser beam incident on the uppermost stream side optical element of the optical elements depicted in a given drawing, and for the pulsed laser beam outputted from the downmost stream side optical element, are shown appropriately in selected drawings. The coordinate systems for the pulsed laser beam incident on other optical elements are shown appropriately as necessary.

In an optical element, the "plane of incidence" refers to a plane perpendicular to the surface on which the pulsed laser beam is incident and containing the beam axis of the pulsed laser beam incident thereon. A polarization component perpendicular to the plane of incident is referred to as the "S-polarization component," and a polarization component parallel to the plane of incident is referred to as the "P-polarization component."

3. Overview of EUV Light Generation System 3.1 Configuration

FIG. 1 schematically illustrates the configuration of an exemplary laser produced plasma (LPP) type EUV light generation system. An EUV light generation apparatus 1 may be used with at least one laser apparatus 3. In this application, a system including the EUV light generation apparatus 1 and the laser apparatus 3 may be referred to as an EUV light generation system 11. As illustrated in FIG. 1, and described in more detail below, the EUV light generation apparatus 1 may include a chamber 2, a target supply unit (e.g., droplet generator 26), and so forth. The chamber 2 may be airtightly sealed. The target supply unit 26 may be mounted to the chamber 2 so as to pass through the wall of the chamber 2, for example. A target material to be supplied by the target supply unit 26 may include, but is not limited to, tin, terbium, gadolinium, lithium, xenon, or any combination, alloy, or mixture thereof.

The chamber 2 may have at least one through-hole formed in the wall thereof. The through-hole may be covered with a window 21, and a pulsed laser beam 32 may travel through the window 21 and into the chamber 2. An EUV collector mirror 23 having a spheroidal reflective surface may be disposed inside the chamber 2, for example. The EUV collector mirror 23 may have first and second foci. The EUV collector mirror 23 may have a multi-layered reflective film formed on a surface thereof, and the reflective film can include molybdenum and silicon that is laminated in alternate layers, for example. The EUV collector mirror 23 may preferably be disposed such that the first focus thereof lies in a plasma generation region 25 and the second focus thereof lies in an intermediate focus (IF) region 292 defined by the specification of an exposure apparatus 60. The EUV collector mirror 23 may have a through-hole 24 formed at the center thereof, and a pulsed laser beam 33 may travel through the through-hole 24.

Still referring to FIG. 1, the EUV light generation system 11 may include an EUV light generation controller 5. Further, the EUV light generation apparatus 1 may include a target sensor 4. The target sensor 4 may have an imaging function and may detect at least one of the presence, trajectory, and position of a target.

The EUV light generation apparatus 1 may further include a connection part 29 for allowing the interior of the chamber 2 and the interior of the exposure apparatus 60 to be in communication with each other. A wall 291 having an aperture may be disposed inside the connection part 29. The wall 291 may be disposed such that the second focus of the EUV collector mirror 23 lies in the aperture formed in the wall 291.

The EUV light generation system 11 may further include a laser beam direction control unit 34, a laser beam focusing mirror 22, and a target collection unit 28 for collecting a target 27. The laser beam direction control unit 34 may include an optical element for defining the direction in which the laser beam travels and an actuator for adjusting the position and the orientation (or posture) of the optical element.

3.2 Operation

With continued reference to FIG. 1, a pulsed laser beam 31 outputted from the laser apparatus 3 may pass through the laser beam direction control unit 34 and outputted therefrom as a pulsed laser beam 32 after having its direction optionally adjusted. The pulsed laser beam 32 may travel through the window 21 and enter the chamber 2. The pulsed laser beam 32 may travel inside the chamber 2 along at least one beam path from the laser apparatus 3, be reflected by the laser beam focusing mirror 22, and strike at least one target 27 as a pulsed laser beam 33.

The droplet generator 26 may output the targets 27 toward the plasma generation region 25 inside the chamber 2. The target 27 may be irradiated by at least one pulse of the pulsed laser beam 33. The target 27, which has been irradiated by the pulsed laser beam 33, may be turned into plasma, and rays of light including EUV light 251 may be emitted from the plasma. The EUV light 251 may be reflected selectively by the EUV collector mirror 23. EUV light 252 reflected by the EUV collector mirror 23 may travel through the intermediate focus region 292 and be outputted to the exposure apparatus 60. The target 27 may be irradiated by multiple pulses included in the pulsed laser beam 33.

The EUV light generation controller 5 may integrally control the EUV light generation system 11. The EUV light generation controller 5 may be configured to process image data of the droplet (i.e., target 27) captured by the target sensor 4. Further, the EUV light generation controller 5 may control at least one of the timing at which the target 27 is outputted and the direction into which the target 27 is outputted (e.g., the timing with which and/or direction in which the target is output from droplet generator 26). Furthermore, the EUV light generation controller 5 may control at least one of the timing with which the laser apparatus 3 oscillates (e.g., by controlling laser apparatus 3), the direction in which the pulsed laser beam 31 travels (e.g., by controlling laser beam direction control unit 34), and the position at which the pulsed laser beam 33 is focused (e.g., by controlling laser apparatus 3, laser beam direction control unit 34, or the like), for example. It will be appreciated that the various controls mentioned above are merely examples, and other controls may be added as necessary.

3.3 Burst Operation Mode

Figure 2:
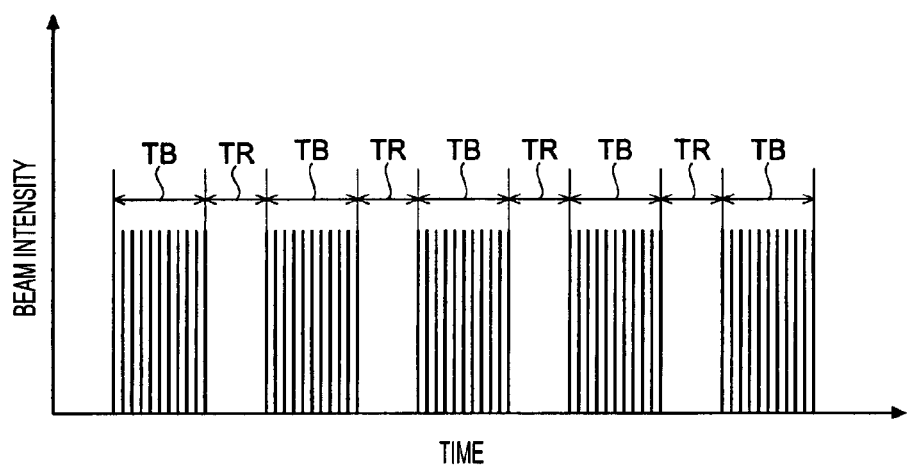
FIG. 2 shows operation modes of a laser apparatus.

FIG. 2 is a diagram showing operation modes of the laser apparatus, such as the laser apparatus 3 described above with reference to FIG. 1. When wafers are exposed in an exposure apparatus, an EUV light generation system used with the exposure apparatus may be required to output EUV light in pulses at a predetermined repetition rate (hereinafter, referred to as pulsed EUV light) to the exposure apparatus for a given period. On the other hand, while a wafer is moved or replaced or a mask is replaced, the EUV light generation system may be required to stop supplying the pulsed EUV light to the exposure apparatus for a certain period. The burst operation mode may be one of several different modes or states of operation of the laser apparatus 3. For example, in the burst operation mode, a pulsed laser beam may be outputted at a predetermined repetition rate during a first predetermined period, and the pulsed laser beam may not be outputted during a second predetermined period. The first and second periods may be non-overlapping periods, and may be repeated in alternation. For example, as shown in FIG. 2, a pulsed laser beam of uniform beam intensity may be outputted at a predetermined repetition rate during a burst period TB, and the pulsed laser beam may not be outputted during a burst rest period TR. The pulsed laser beam may also be outputted during a series of burst periods TB (e.g., burst periods that are repeated periodically), and the pulsed laser beam may not be outputted during a corresponding series of burst rest periods TR (e.g., rest periods that are repeated periodically).

In the EUV light generation system, as shown in FIG. 2, in order to put the EUV light generation system in a burst operation mode, where the pulsed EUV light is outputted as necessary, the laser apparatus 3 may be required to be put in a burst operation mode, where a burst of a pulsed laser beam at a predetermined repetition rate is outputted as necessary.

Here, in order to reduce power consumption in the laser apparatus during the burst rest period TR, application of a voltage for causing a discharge in an amplifier may be suspended, or the excitation intensity of an amplifier may be lowered (weak excitation). However, when an amplifier in the laser apparatus 3 is switched from an OFF state to a strongly-excited state at the start of the burst period TB in the burst operation, the energy of the lead pulses of the pulsed laser beam may become unstable.

4. Control System of Laser Apparatus

Accordingly, this disclosure may provide various embodiments of laser apparatuses, as described in detail below.

4.1 Configuration

Figure 3:
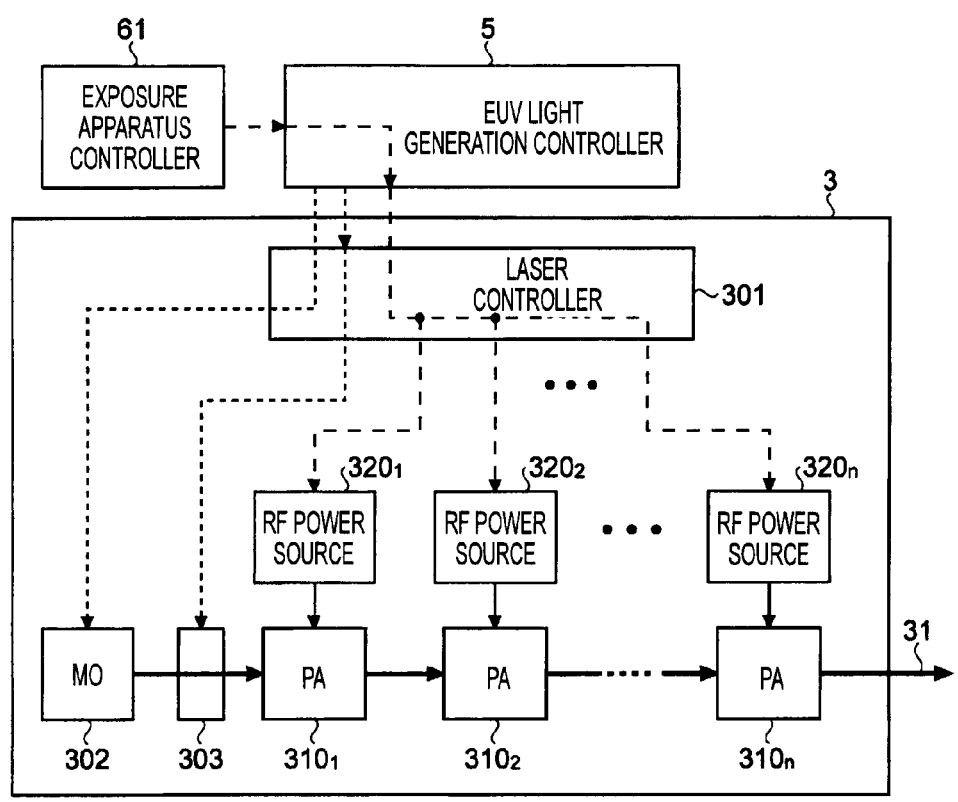
FIG. 3 schematically illustrates the configuration of a laser apparatus.

FIG. 3 schematically illustrates the configuration of the laser apparatus 3, as described above with reference to FIG. 1. As illustrated in FIG. 3, the laser apparatus 3 may include a master oscillator (MO) $302_n$, amplifiers (PA) $310_1$ through $310_n$, RF power sources $320_1$ through $320_n$, at least one optical shutter 303, and a laser controller 301. A power source (not shown) may be connected to the master oscillator 302. The RF power sources $320_1$ through $320_n$ may be communicably connected to the amplifiers $310_1$ through $310_n$, respectively. The optical shutter 303 may be disposed downstream from the master oscillator 302 in a beam path of a pulsed laser beam outputted from the master oscillator 302. The amplifiers $310_1$ through $310_n$ may also be disposed on the beam path of the pulsed laser beam outputted from the master oscillator 302. Here, however, the optical shutter 303 is not a requisite.

The master oscillator 302 may be communicably connected to the laser controller 301. Moreover, the RF power sources $320_1$ through $320_n$ may each be communicably connected to the laser controller 301.

4.2 Operation

In the above configuration, the laser controller 301 may cause the master oscillator 302 to oscillate at a predetermined repetition rate. For example, the laser controller 301 may cause the optical shutter 303 to operate in order to put the laser apparatus 3 in the burst operation mode. The laser controller 301 may open the optical shutter 303 (e.g., to a state where the pulsed laser beam is able to pass therethrough) during the burst period TB and close the optical shutter 303 (e.g., to a state where the pulsed laser beam is blocked thereby) during the burst rest period TR. The laser controller 301 may cause the RF power sources $320_1$ through $320_n$ to operate prior to the beginning of a burst period TB for a predetermined time so that the amplifiers $310_1$ through $310_n$ may reach first excitation intensity. The aforementioned predetermined time may be referred to as a predetermined time Ts (see FIG. 4). Further, the laser controller 301 may cause the RF power sources $320_1$ through $320_n$ to operate such that the amplifiers $310_1$ through $310_n$ are put in second excitation intensity, which is lower than the first excitation intensity, from the beginning of a burst rest period TR to a point in time preceding the beginning of a subsequent burst period TB for the predetermined time Ts. Here, controlling the excitation intensity in the amplifiers $310_1$ through $310_n$ may be a factor affecting the power consumption in the amplifiers $310_1$ through $310_n$. In one or more embodiments, the switching of the optical shutter 303 is not essential for achieving reduction in power consumption.

4.3 Effect

Making the master oscillator 302 oscillate continually at a predetermined repetition rate may allow the pulsed laser beam outputted from the master oscillator 302 to be stabilized. Here, a burst output of the pulsed laser beam may be generated by switching the optical shutter 303; thus, the master oscillator 302 does not need to be turned off during the burst rest periods TR.

The laser controller 301 may cause the RF power sources $320_1$ through $320_n$ to operate prior to the beginning of a burst period TB for the predetermined time Ts such that the amplifiers $310_1$ through $310_n$ are put in the first excitation intensity. With this, energy stability of the amplified pulsed laser beam may be improved. The precise definition of the "stability" will be discussed later with reference to FIG. 12.

Further, the laser controller 301 may cause the RF power sources $320_1$ through $320_n$ to operate such that the amplifiers $310_1$ through $310_n$ are put in the second excitation intensity, which is lower than the first excitation intensity, from the beginning of a burst rest period TR to a point in time preceding the beginning of a subsequent burst period TB for the predetermined time Ts. With this, the power to be supplied to the RF power sources $320_1$ through $320_n$ may be reduced, whereby the energy saving may be achieved while achieving the energy stability of the pulsed laser beam at the same time.

4.4 Variations

Figure 4:
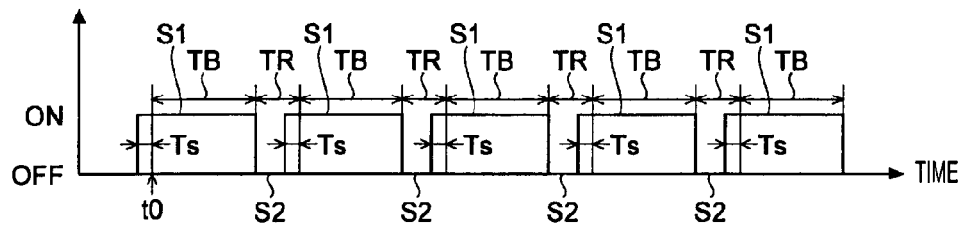
FIG. 4 is a timing chart showing burst permission signals and burst prohibition signals which a laser controller may receive from an exposure apparatus controller through an EUV light generation controller.

Referring to FIG. 4, with continued reference to FIG. 3, a burst permission signal S1 may be inputted to the laser controller 301 from an exposure apparatus controller 61 (see FIG. 3) prior to the beginning of a burst period TB for the predetermined time Ts. Then, the laser controller 301 may cause, with the input of the burst permission signal S1 as a trigger, the RF power sources $320_1$ through $320_n$ to operate at the strong excitation prior to the beginning of the burst period TB for the predetermined time Ts. Further, a burst prohibition signal S2 may be inputted to the laser controller 301 from the exposure apparatus controller 61. Then, the laser controller 301 may cause, with the input of the burst prohibition signal S2 as a trigger, the RF power sources $320_1$ through $320_n$ to operate at the weak excitation.

In the configuration shown in FIG. 3, the optical shutter 303 is disposed between the master oscillator 302 and the amplifier $310_1$. However, this embodiment is not limited thereto, and the optical shutter 303 may be disposed in a beam path between any two of the amplifiers $310_1$ through $310_n$. For example, the laser controller 301 may control the RF power source(s) for all the amplifiers $310_1$ through $310_n$ in the laser apparatus 3 or for at least one or more amplifiers $310_1$ through $310_n$ disposed downstream from the optical shutter 303 to switch between the strong excitation and weak excitation, as in the operation generally described above.

4.5 Timing Charts

Waveforms of various signals and of the pulsed laser beam in the laser apparatus 3 depicted in FIG. 3 will now be described with reference to several of the following drawings.

Figure 5:
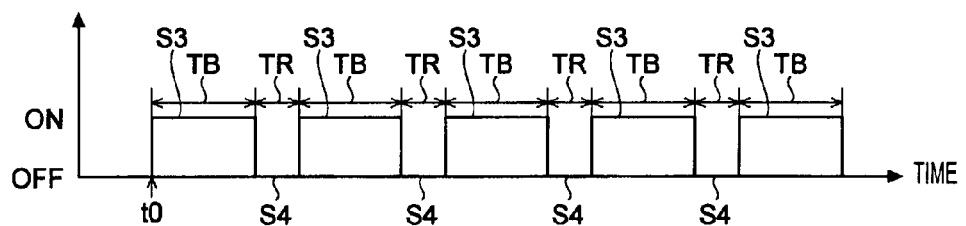
FIG. 5 is a timing chart showing burst ON signals and burst OFF signals which a laser controller may receive from an EUV light generation controller.

FIG. 4 is a timing chart showing the burst permission signals S1 and the burst prohibition signals S2 which the laser controller 301 may receive from the exposure apparatus controller 61 through the EUV light generation controller 5. FIG. 5 is a timing chart showing burst ON signals S3 and burst OFF signals S4 which the laser controller 301 may receive from the EUV light generation controller 5. The burst permission signal S1 may be a signal through which the exposure apparatus controller 61 permits the laser apparatus 3 to output the pulsed laser beam. The burst ON signal S3, in the mean time, may be a signal through which the EUV light generation controller 5 commands the laser controller 301 to cause the laser apparatus 3 to output the pulsed laser beam. Accordingly, a period in which the burst ON signal S3 is being outputted from the EUV light generation controller 5 may correspond to a burst period TB. In the description to follow, a signal where a voltage level is at an "ON" level may be designated as the burst permission signal S1, and a signal where the voltage level is at an "OFF" level may be designated as the burst prohibition signal S2. Similarly, a signal where a voltage level is at an "ON" level may be designated as the burst ON signal S3, and a signal where the voltage level is at an "OFF" level may be designated as the burst OFF signal S4. The voltage level corresponding to an "OFF" level may be zero.

The burst ON signal S3 may be inputted to the laser controller 301 at a timing delayed by the predetermined time Ts from the rise of the burst permission signal S1. The burst prohibition signal S2 may be a signal through which the exposure apparatus controller 61 prohibits the laser apparatus 3 to output the pulsed laser beam. The burst OFF signal S4 may be a signal through which the EUV light generation controller 5 causes the laser apparatus 3 to stop outputting the pulsed laser beam. The burst prohibition signal S2 and the burst OFF signal S4 may be inputted to the laser controller 301 at the same time. That is, the fall of the burst permission signal S1 may coincide with the fall of the burst ON signal S3.

Figure 6:
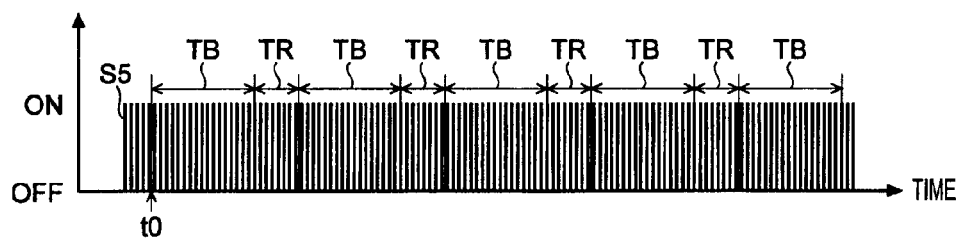
FIG. 6 is a timing chart showing oscillation triggers which a laser controller may receive from an EUV light generation controller and input to a master oscillator.

FIG. 6 is a timing chart showing oscillation triggers S5 which the laser controller 301 may receive from the EUV light generation controller 5 and input to the master oscillator 302. As shown in FIG. 6, the oscillation triggers S5 may be inputted to the master oscillator 302 at a predetermined repetition rate from a timing at which the laser apparatus 3 is started up and becomes operable. The timing at which the laser apparatus 3 becomes operable means a timing at which the laser apparatus 3 comes into a state capable of oscillating. For example, the oscillation triggers S5 may be inputted to the master oscillator 302 continually at a predetermined repetition rate after the laser controller 301 initially receives the burst permission signal S1 from the EUV light generation controller 5. Accordingly, the oscillation triggers S5 may be inputted to the master oscillator 302 at the predetermined repetition rate even during the burst rest period TR.

Figure 7:
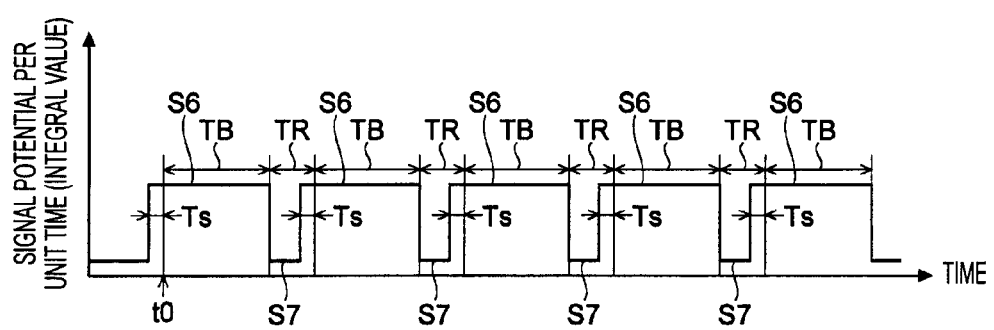
FIG. 7 is a timing chart showing strong-excitation signals and weak-excitation signals which a laser controller may input to an RF power source of an amplifier.

FIG. 7 is a timing chart showing strong-excitation signals S6 and weak-excitation signals S7 which the laser controller 301 may input to the RF power sources $320_1$ through $320_n$. As shown in FIG. 7, the laser controller 301 may input the strong-excitation signals S6 to the respective RF power sources $320_1$ through $320_n$ during a period for which the burst permission signal S1 is inputted to the laser controller 301 from the exposure apparatus controller 61 through the EUV light generation controller 5. Accordingly, the RF power sources $320_1$ through $320_n$ may input high-frequency voltage for strong excitation to the respective amplifiers $310_1$ through $310_n$ for that period. The rise of the burst ON signal S3 may be delayed by the predetermined time Ts from the rise of the strong-excitation signal S6.

Figure 8:
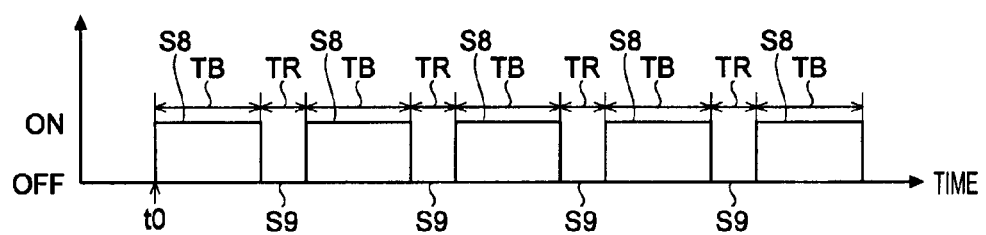
FIG. 8 is a timing chart showing open signals and close signals which a laser controller may input to an optical shutter.
Figure 9:
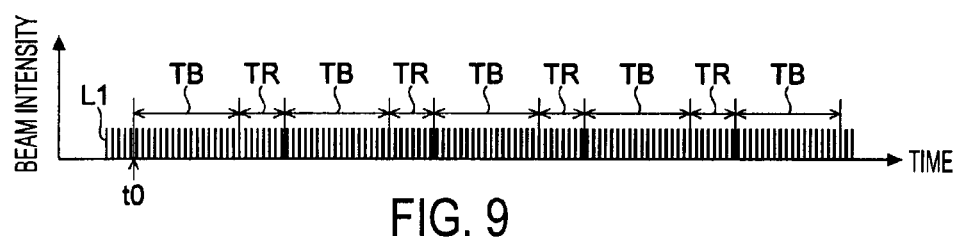
FIG. 9 is a timing chart showing a pulsed laser beam outputted from a master oscillator.
Figure 10:
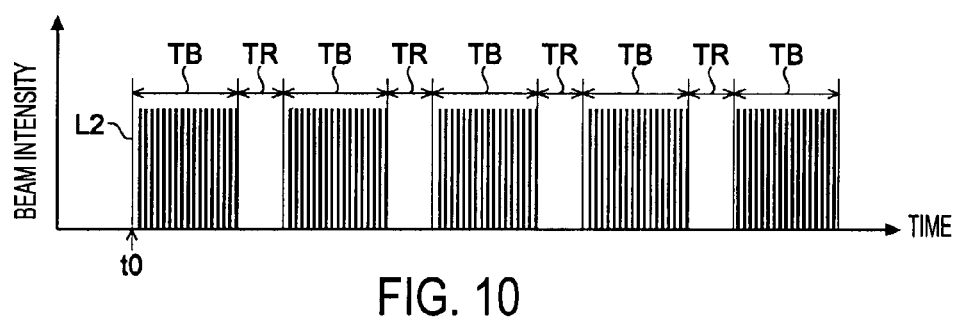
FIG. 10 is a timing chart showing a pulsed laser beam outputted from an amplifier disposed downstream from an optical shutter.

FIG. 8 is a timing chart showing open signals S8 and close signals S9 which the laser controller 301 may input to the optical shutter 303. FIG. 9 is a timing chart showing a pulsed laser beam L1 outputted from the master oscillator 302. FIG. 10 is a timing chart showing a pulsed laser beam L2 outputted from the amplifier $310_n$ disposed at the downmost side in the beam path, for example. As shown in FIG. 8, the laser controller 301 may input the open signal S8 for putting the optical shutter 303 in an open state during a period for which the burst ON signal S3 is inputted from the EUV light generation controller 5, that is, during the burst period TB. The laser controller 301 may input the close signal S9 for putting the optical shutter 303 in a closed state outside of the above period, that is, during the burst rest period TR. On the other hand, as shown in FIG. 9, the master oscillator 302 may continually output the pulsed laser beam L1 at a predetermined repetition rate in accordance with the oscillation triggers S5 (see FIG. 6). Thus, the pulsed laser beam L1 may be blocked by the optical shutter 303 during the burst rest periods TR. As a result, the amplified pulsed laser beam L2 may be outputted from the amplifier $310_n$ only during the burst periods TB.

4.6 Burst Operation and Pulse Energy Characteristics

Figure 11:
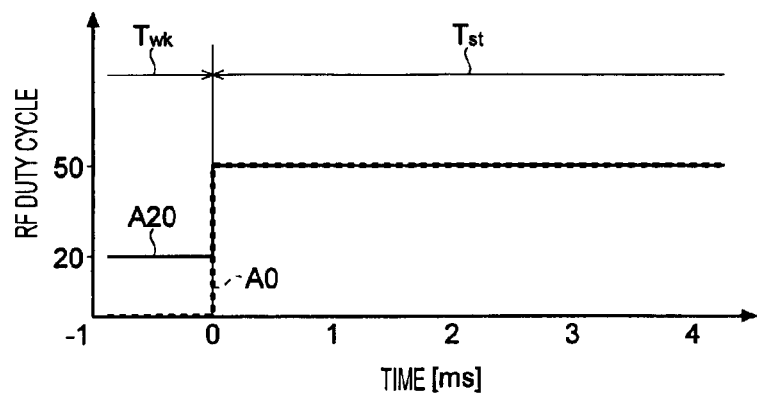
FIG. 11 is a timing chart showing an excitation voltage inputted to an amplifier from an RF power source with the excitation intensity at a duty cycle of 0% (no excitation) and an excitation voltage inputted to an amplifier from an RF power source with the excitation intensity at a duty cycle of 20% during a weak-excitation period.
Figure 12:
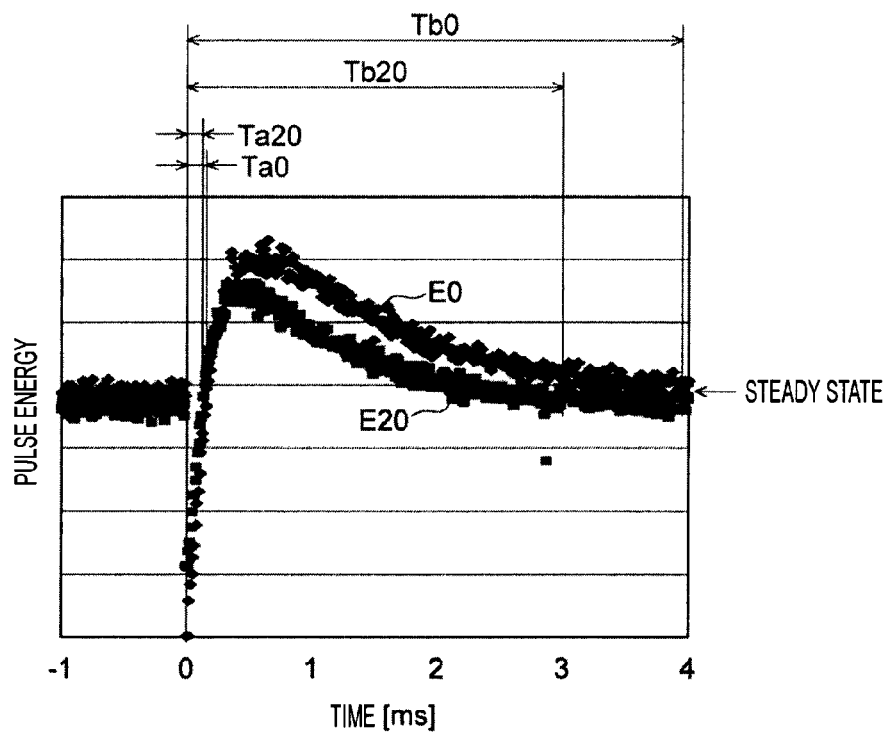
FIG. 12 is a graph showing changes in energy of pulsed laser beams outputted from an amplifier when the excitation voltages shown in FIG. 11 are inputted to the amplifier from an RF power source.
Figure 13:
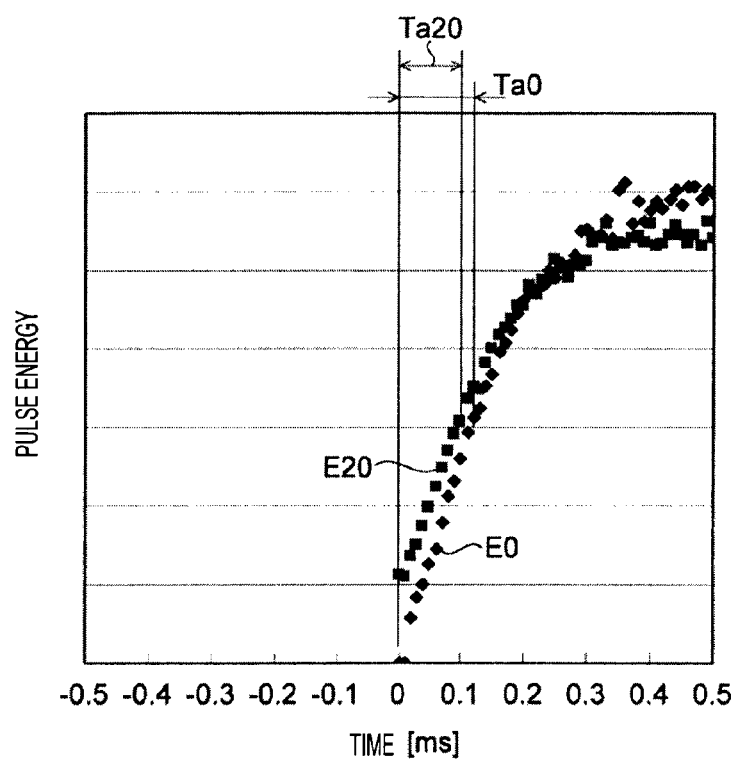
FIG. 13 shows a part of the graph shown in FIG. 12 in enlargement.

Subsequently, changes in energy of the amplified pulsed laser beam in the case where the pulsed laser beam enters the amplifier at the same time as the amplifier is switched from the weak excitation to the strong excitation will be discussed below. FIG. 11 is a timing chart showing a case where the excitation voltage inputted to the amplifier from the RF power source is at a duty cycle of 0% (i.e., no excitation) and a case where the excitation voltage inputted to the amplifier from the RF power source is at a duty cycle of 20% during a weak-excitation period $T_{wk}$. In FIG. 11, a dotted line indicates an excitation voltage A0 at a duty cycle of 0%, and a solid line indicates an excitation voltage A20 at a duty cycle of 20%. FIG. 12 is a graph showing changes in energy of the respective pulsed laser beams outputted from the amplifier when the excitation voltages A0 and A20 shown in FIG. 11 are inputted to the amplifier from the RF power source. In the plotted data shown in FIG. 12, E0 designates the energy of the pulsed laser beam when the excitation voltage A0 is inputted, and E20 designates the energy of the pulsed laser beam when the excitation voltage A20 is inputted. FIG. 13 shows an enlarged part of the graph shown in FIG. 12.

With reference to FIGS. 11 through 13, the energy of the pulsed laser beam (hereinafter, referred to as "pulse energy") rises rapidly from a level lower than a steady state immediately after the excitation intensity is switched (e.g., in 1 ms). Then, the pulse energy may overshoot beyond the pulse energy of the steady state approximately after a time Ta from the timing at which the excitation intensity has been switched. Thereafter, the pulse energy may gradually fall and be stabilized at the pulse energy of the steady state approximately in a time Tb from the timing at which the excitation intensity has been switched.

For example, as illustrated a time Ta0 in which E0 exceeds the pulse energy of the steady state is approximately 0.17 ms, and a time Tb0 in which E0 is stabilized in the steady state is approximately 4 ms. Further, in ED, the pulse energy approaches zero instantaneously immediately after the excitation intensity is switched. On the other hand, a time Ta20 in E20 exceeds the pulse energy of the steady state is approximately 0.15 ms, and a time Tb20 in which E20 is stabilized in the steady state is approximately 3 ms. The peak value of the pulse energy when E20 overshoots is lower by approximately 10% than the peak value of the pulse energy when E0 overshoots. Further, in E20, the pulse energy does not approach zero even immediately after the excitation intensity is switched.

In this way, the time Tb required for the pulse energy to be stabilized in the steady state may be shorter and the peak value of overshooting may be smaller when the weak excitation is at a duty cycle of 20% than at a duty cycle of 0%. This suggests that the pulse energy can be stabilized more quickly when the excitation level is switched to the strong excitation from the weak excitation than from the no excitation. Based on this, it is contemplated that the excitation voltage to be inputted to the amplifier during the weak-excitation period $T_{wk}$ is preferably at a level as close to the level of the strong excitation as possible while taking the energy saving into consideration. Further, it is contemplated that a situation where the pulse energy is disadvantageously not outputted momentarily at the beginning of a strong-excitation period $T_{st}$ can be prevented if the excitation level is retained even slightly above the no excitation level during the weak excitation period $T_{wk}$.

Further, regardless of the duty cycle of the excitation intensity during the weak-excitation period $T_{wk}$, the rise of the burst ON signal S3 may preferably be delayed by the time Ta from the rise of the burst permission signal S1. With this, a situation where the pulsed laser beam is advantageously not outputted at the beginning of a burst period TB may be suppressed. More preferably, the rise of the burst ON signal S3 may be delayed by the time Tb from the rise of the burst permission signal S1. With this, effect of overshooting of the pulse energy may be suppressed. In one or more embodiments, the times Ta and Tb here may be determined in advance based on experiment, empirical data, simulation, and the like.

4.7 Control Flow

Figure 14:
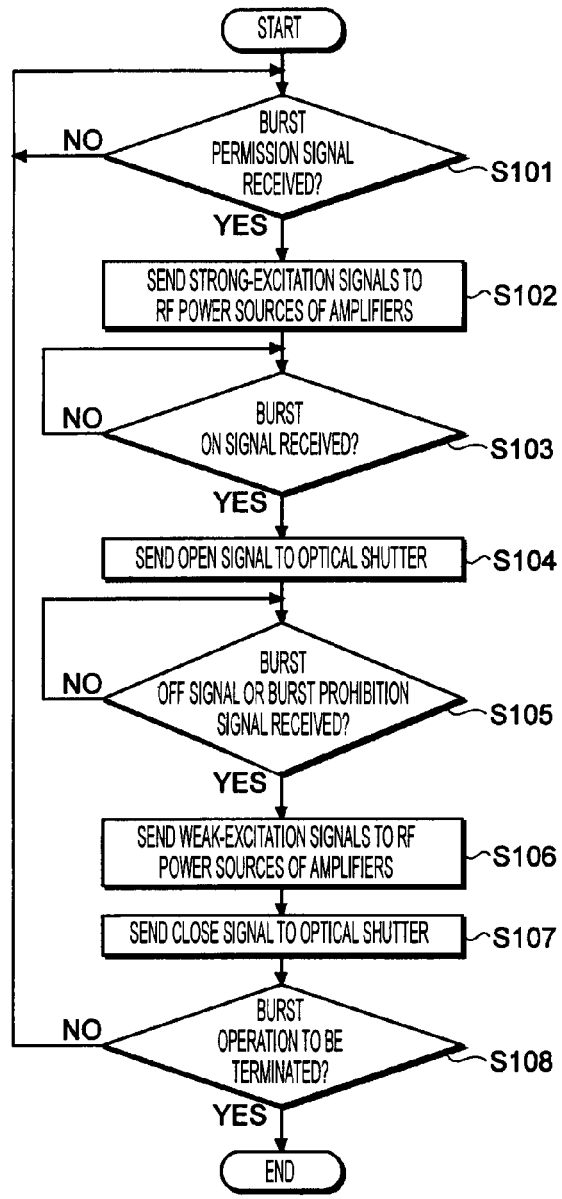
FIG. 14 is a flowchart showing an operation of a laser controller.

The operation of the laser controller 301 will now be discussed. Referring to FIG. 14, with continued reference to FIG. 3, illustrated is a flowchart showing the operation of the laser controller 301. As shown in FIG. 14, the laser controller 301 may stand by until it receives the burst permission signal S1 (see FIG. 4) from the exposure apparatus controller 61 through the EUV light generation controller 5 (Step S101; NO). Upon receiving the burst permission signal S1 (Step S101; YES), the laser controller 301 may be configured to input the strong-excitation signals S6 (see FIG. 7) to the RF power sources $320_1$ through $320_n$ of the respective amplifiers $310_1$ through $310_n$.

Then, the laser controller 301 may stand by until it receives the burst ON signal S3 from the EUV light generation controller 5 (Step S103; NO). Upon receiving the burst ON signal S3 (Step S103; YES), the laser controller 301 may be configured to input the open signal S8 (see FIG. 8) to the optical shutter 303 for opening the optical shutter 303 (Step S104).

Subsequently, the laser controller 301 may stand by until it receives the burst OFF signal S4 (see FIG. 5) or the burst prohibition signal S2 (see FIG. 4) from the EUV light generation controller 5 (Step S105; NO). Upon receiving the burst OFF signal S4 or the burst prohibition signal S2 (Step S105; YES), the laser controller 301 may be configured to switch the voltage inputted to the RF power sources $320_1$ through $320_n$ to the weak-excitation signal S7 (see FIG. 7) (Step S106). Further, the laser controller 301 may be configured to input the close signal S9 (see FIG. 8) to the optical shutter 303 for closing the optical shutter 303 (Step S107).

Thereafter, the laser controller 301 may determine whether or not the burst operation is to be terminated based on the signal from the exposure apparatus controller 61 (Step S108). When the burst operation is to be terminated (Step S108; YES), this operation may be ended. On the other hand, when the burst operation is to be continued (Step S108; NO), the laser controller 301 may be configured to return to Step S101 and repeat the subsequent steps.

Figure 15:
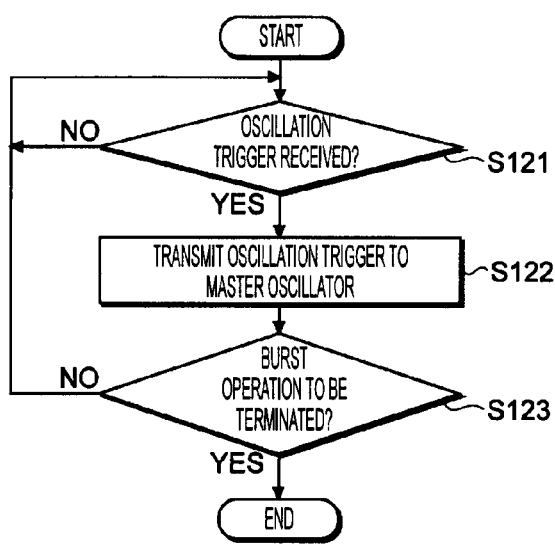
FIG. 15 is a flowchart showing the operation of a laser controller causing a master oscillator to generate a pulsed laser beam at a predetermined repetition rate.

Further, the laser controller 301 may be configured to cause the master oscillator 302 to output the pulsed laser beam at a predetermined repetition rate, in parallel with the operation shown in FIG. 14. Referring to FIG. 15, with continued reference to FIG. 3, illustrated is a flowchart showing the operation where the laser controller 301 causes the master oscillator 302 to output the pulsed laser beam at the predetermined repetition rate. As shown in FIG. 15, the laser controller 301 may stand by until it receives, for example, a single oscillation trigger S5 (see FIG. 6) from the EUV light generation controller 5 (Step S121; NO). Upon receiving the oscillation trigger S5 (Step S121; YES), the laser controller 301 may be configured to transmit the single oscillation trigger S5 (see FIG. 6) to the master oscillator 302 (Step S122). With this, a single pulse of the pulsed laser beam L1 (see FIG. 9) may be outputted from the master oscillator $302_n$ for example. Thereafter, the laser controller 301 may be configured to determine whether or not the burst operation is to be terminated based on the signal from the exposure apparatus controller 61 (Step S123). When the burst operation is to be terminated (Step S123; YES), this operation may be ended. On the other hand, when the burst operation is to be continued (Step S123; NO), the laser controller 301 may be configured to return to Step S121 and repeat the subsequent steps.

5. Method for Controlling Excitation Intensity of Amplifier

The control of the excitation intensity will now be described. Here, a pulse width modulation (PWM) method, a potential control method, and a combination of these methods will be discussed as examples for controlling the excitation intensity.

5.1 PWM Method

In the PWM method, the duty cycle of the voltage pulses may be varied, i.e., a pulse width is modulated. In this example, the duty cycle of the voltage pulses to be inputted to the amplifiers $310_1$ through $310n$ from the respective RF power sources $320_1$ through $320_n$ may be varied between the strong-excitation control and the weak-excitation control. As used herein, "duty cycle" may mean a ratio of a pulse width with respect to a single cycle of a periodic pulse wave, and may be represented by Expression (1) below.

$$D = \tau/T \quad (1)$$

As used in Expression (1), D indicates a duty cycle, τ indicates a pulse width, and T indicates a temporal length of a single cycle. For example, when a cycle T is 10 μs and a pulse width τ is 1 μs, a duty cycle D turns out to be 0.1 (10%), based on Expression (1) above.

Figure 16:
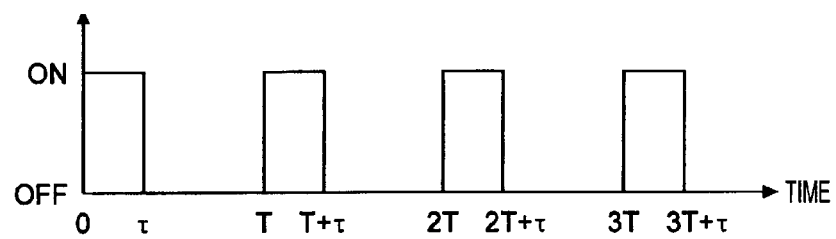
FIG. 16 shows excitation signals inputted to an RF power source from a laser controller when the duty cycle is at τ/T.
Figure 17:
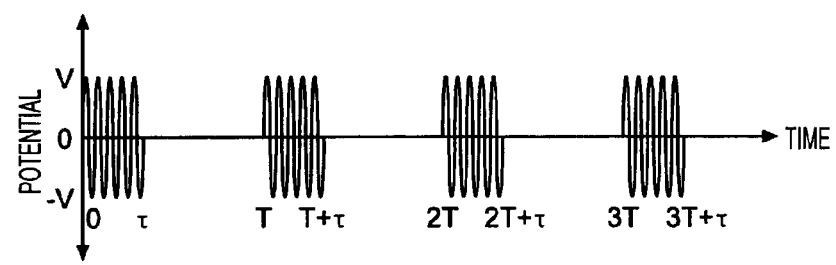
FIG. 17 shows excitation voltages supplied to the amplifier from the RF power source in the case shown in FIG. 16.

Referring to FIG. 16, with continued reference to FIG. 3, illustrated is excitation signals (S6 or S7) to be inputted to the RF power sources $320_1$ through $320_n$ from the laser controller 301 when the duty cycle is τ/T. FIG. 17, with continued reference to FIG. 3, shows the excitation voltages inputted to the amplifiers $310_1$ through $310_n$ from the respective RF power sources $320_1$ through $320_n$ in the embodiment shown in FIG. 16. As shown in FIG. 16, in the PWM method, rectangular-wave signals, for example, may be inputted to the RF power sources $320_1$ through $320_n$ from the laser controller 301. As a result, intermittent RF voltages as shown in FIG. 17 may be inputted to the amplifiers $310_1$ through $310_n$ from the respective RF power sources $320_1$ through $320_n$.

Figure 18:
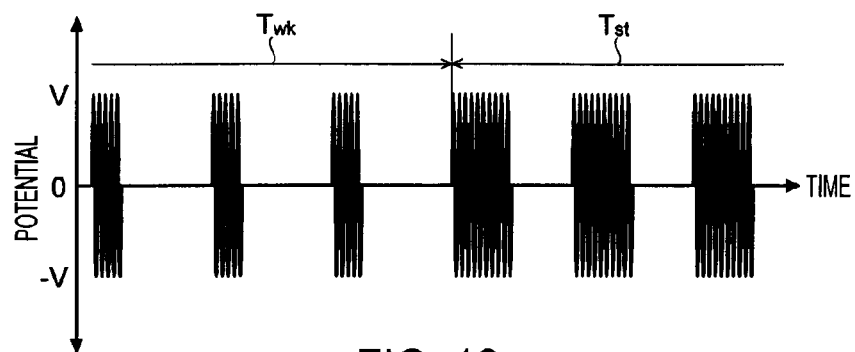
FIG. 18 shows RF voltages inputted to an amplifier from an RF power source when a weak-excitation signal during the weak-excitation period is at a duty cycle of 20% and a strong-excitation signal during the strong-excitation period is at a duty cycle of 50%.
Figure 19:
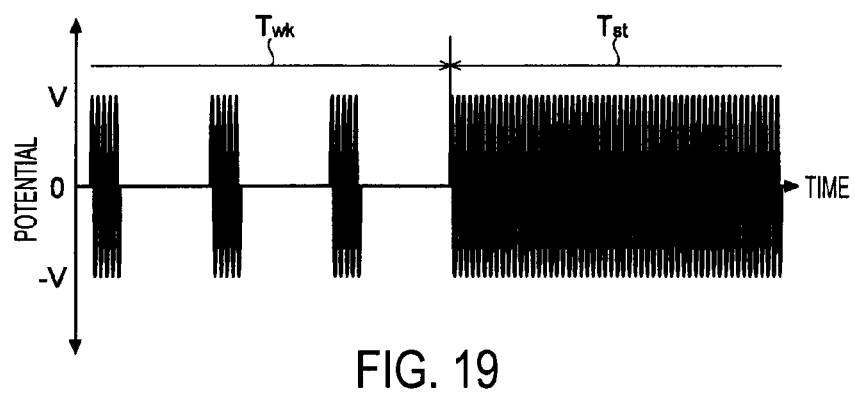
FIG. 19 shows RF voltages inputted to an amplifier from an RF power source when a weak-excitation signal during the weak-excitation period is at a duty cycle of 20% and a strong-excitation signal during the strong-excitation period is at a duty cycle of 100%.

In the PWM method, switching between the weak-excitation control and the strong-excitation control may be achieved by, for example, changing the duty cycle of the rectangular-wave. Referring to FIG. 18, with continued reference to FIG. 3, illustrated is the RF voltages to be inputted to the amplifiers $310_1$ through $310_n$ from the respective RF power sources $320_1$ through $320_n$ when the duty cycle specified by the weak-excitation signals S7 during the weak-excitation period $T_{wk}$ is 20% and the duty cycle specified by the strong-excitation signals S6 during the strong-excitation period $T_{st}$ is 50%. FIG. 19, also with continued reference to FIG. 3, shows the RF voltages to be inputted to the amplifiers $310_1$ through $310_n$ from the respective RF power sources $320_1$ through $320_n$ when the duty cycle specified by the weak-excitation signals S7 during the weak-excitation period $T_{wk}$ is 20% and the duty cycle specified by the strong-excitation signals S6 during the strong-excitation period $T_{st}$ is 100%.

As shown in FIGS. 18 and 19, the excitation intensity of the gain medium inside the amplifiers $310_1$ through $310_n$ may be varied by changing the duty cycle of the RF voltages to be applied between the electrodes provided in the amplifiers $310_1$ through $310_n$. The duty cycle during the weak-excitation period $T_{wk}$ may be made smaller than the duty cycle during the strong-excitation period $T_{st}$. This may allow the excitation energy supplied to the amplifiers $310_1$ through $310_n$ per unit time during the weak-excitation period $T_{wk}$ to be made smaller than that during the strong-excitation period $T_{st}$, which may lead to energy saving.

Here, the RF frequency of an amplifier which contains $CO_2$ gas as a gain medium is typically between 10 and 100 MHz. When the cycle T is 10 μs as in this example, the PWM frequency is 100 kHz (=1/T). In this way, the PWM cycle may preferably be set so as to be sufficiently large with respect to the RF cycle. Further, the repetition rate of the pulsed laser beam outputted from the master oscillator 302 may preferably be 100 kHz, for example, and be synchronized with the PWM cycle T.

5.2 Potential Control Method

Figure 20:
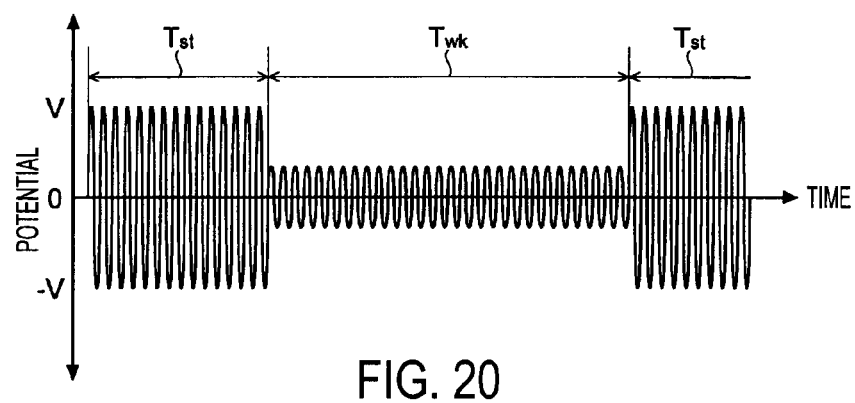
FIG. 20 shows RF voltages inputted to an amplifier from an RF power source in a potential control method.

The potential control method will be discussed next. Referring to FIG. 20, illustrated are RF voltages which may be inputted to the amplifiers $310_1$ through $310_n$ from the respective RF power sources $320_1$ through $320_n$ in the potential control method. In the potential control method, the amplitude specified by the weak-excitation signals S7 may be made smaller than the amplitude specified by the strong-excitation signals S6. As a result, as shown in FIG. 20, the amplitude of the RF voltages inputted to the amplifiers $310_1$ through $310_n$ from the respective RF power sources $320_1$ through $320_n$ may be smaller during the weak-excitation period $T_{Wk}$ than that during the strong-excitation period $T_{st}$. This may allow the excitation energy supplied to the amplifiers $310_1$ through $310_n$ per unit time during the weak-excitation period $T_{wk}$ to be made smaller than that during the strong-excitation period $T_{st}$, which may lead to energy saving.

5.3 Combination of PWM Method and Potential Control Method

Figure 21:
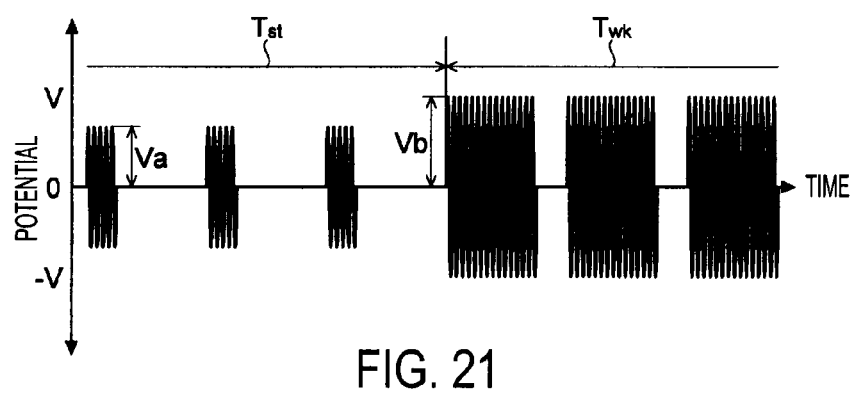
FIG. 21 shows RF voltages inputted to an amplifier from an RF power source in a method where a PWM method and a potential control method are combined.

In one or more embodiments, the PWM method and the potential control method discussed above may be combined. For example, FIG. 21 shows the RF voltages to be inputted to the amplifiers $310_1$ through $310_n$ from the respective RF power sources $320_1$ through $320_n$ in the case where the PWM method and the potential control method are combined. In this way, combining the PWM method and the potential control method may allow the dynamic range of the excitation intensity control to be increased. This, in turn, may allow the RF voltages to be inputted to the amplifiers $310_1$ through $310_n$ from the respective RF power sources $320_1$ through $320_n$ to be adjusted more freely.

6. Laser Apparatus with Semiconductor Lasers as Master Oscillator

The case where a master oscillator in a laser apparatus includes a plurality of semiconductor lasers will now be described below.

6.1 Configuration

Figure 22:
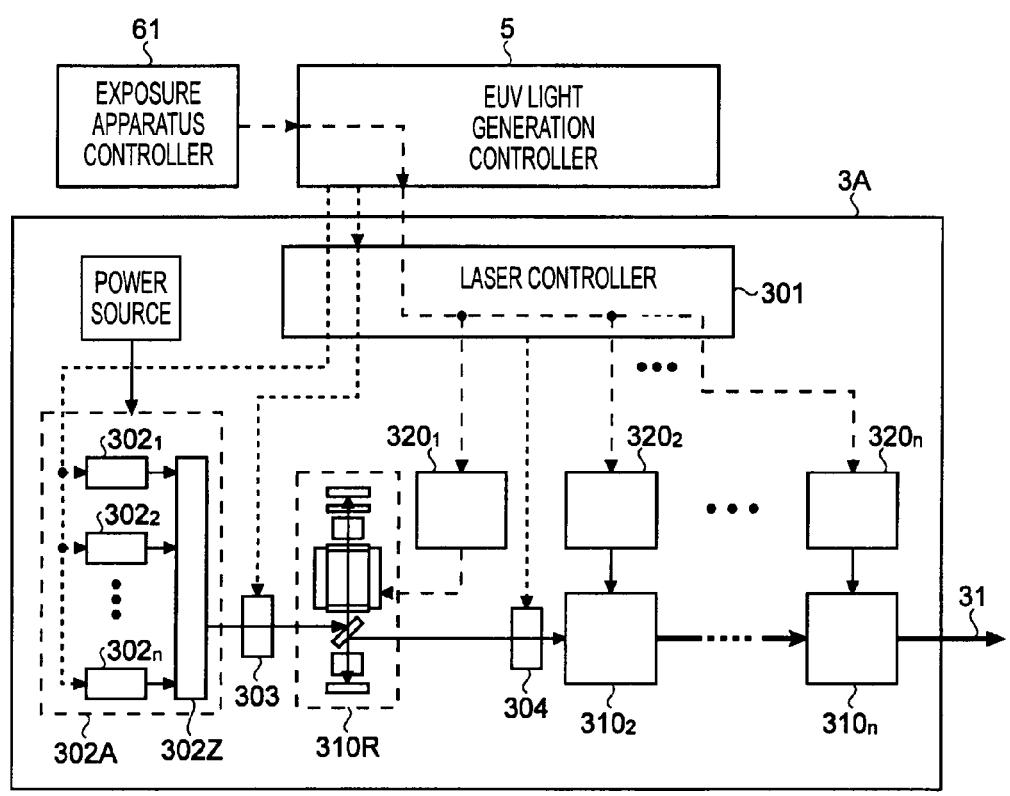
FIG. 22 schematically illustrates the configuration of a laser apparatus in which a master oscillator includes a plurality of semiconductor lasers.

FIG. 22 schematically illustrates the configuration of a laser apparatus 3A which includes a master oscillator 302A including a plurality of semiconductor lasers. In FIG. 22, a regenerative amplifier 310R may be used as the first-stage amplifier $310_1$. Further, an optical shutter 304 may be disposed downstream from the regenerative amplifier 310R. In the description to follow, the gain medium inside the regenerative amplifier 310R and the amplifiers $310_2$ through $310_n$ may be a mixed gas containing, for example, $CO_2$ gas as one component.

As shown in FIG. 22, the master oscillator 302A may include semiconductor lasers $302_1$ through $302_n$. Each of the semiconductor lasers $302_1$ through $302_n$ may be a quantum cascade laser, for example. The semiconductor lasers $302_1$ through $302_n$ may each oscillate at the same wavelength or at different wavelengths. However, each of the semiconductor lasers $302_1$ through $302_n$ may preferably be configured to oscillate at a wavelength that is contained within any of a plurality of gain bandwidths of the gain medium containing $CO_2$ gas. The semiconductor lasers $302_1$ through $302_n$ may each be configured to oscillate in a single-longitudinal mode or in a multi-longitudinal mode. The master oscillator 302A may further include a beam path adjusting unit 302Z for making beam paths of the pulsed laser beams outputted from the respective semiconductor lasers $302_1$ through $302_n$ coincide with one another.

6.2 Operation

The operation of the laser controller 301 shown in FIG. 22 will now be discussed. The laser controller 301 may be configured to control each of the semiconductor lasers $302_1$ through $302_n$ to oscillate at a predetermined repetition rate and at a predetermined timing. The pulsed laser beams outputted from the respective semiconductor lasers $302_1$ through $302_n$ may have their beam paths coincide with one another by a beam path adjusting unit 302Z.

The laser controller 301 may cause at least one of the optical shutters 303 and 304 to operate in order to put the laser apparatus 3A in the burst operation mode. Preferably, the optical shutter 304 disposed downstream from the regenerative amplifier 310R may be operated for the burst operation. Further, at least one of the optical shutters 303 and 304 may serve to suppress a returning laser beam. For example, either optical shutter 303/304 may be opened in synchronization with the timing at which the pulsed laser beam reaches the corresponding optical shutter 303/304, and the corresponding optical shutter 303/304 may be closed in synchronization with the timing at which the pulsed laser beam passes through the corresponding optical shutter 303/304. Here, the timing at which the pulsed laser beam reaches the corresponding optical shutter 303/304 and the timing at which the pulsed laser beam passes through the corresponding optical shutter 303/304 may be calculated in advance using the optical length of the beam path from the master oscillator 302A to the corresponding optical shutter 303/304, the timings of the oscillation triggers, and the pulse width.

The laser controller 301 may be configured to input an excitation signal to the RF power source $320_1$ of the regenerative amplifier 310R such that the regenerative amplifier 310R operates at predetermined excitation intensity, regardless of whether or not the burst ON signal or the burst OFF signal has been received.

Meanwhile, the laser controller 301 may send the following signals to the RF power sources $320_2$ through $320_n$ of the respective amplifiers $310_2$ through $310_n$ (the signals described with reference to FIG. 4 and so forth may be used for these signals). Strong-excitation signal: a signal for causing the amplifiers $310_2$ through $310_n$ to operate at the first excitation intensity for a duration from a point in time prior to the start of a burst period TB for the predetermined time Ts until the start of a burst rest period TR.
Weak-excitation signal: a signal for causing the amplifiers $310_2$ through $310_n$ to operate at the second excitation intensity for a duration from the start of a burst rest period TR until a point in time prior to the start of a subsequent burst period TB for the predetermined time Ts.

6.3 Effect

According to one or more embodiments, making the semiconductor lasers $302_1$ through $302_n$ oscillate continually at a predetermined repetition rate may reduce fluctuations in heat loads on the respective semiconductor lasers $302_1$ through $302_n$. Further, when the laser apparatus 3A is put in the burst operation mode by switching the optical shutter 304 disposed downstream from the regenerative amplifier 310R, the regenerative amplifier 310R may continually amplify the pulsed laser beam at a predetermined repetition rate. With this, fluctuations in a heat load on the regenerative amplifier 310R may be reduced. As a result, fluctuations in the pulse energy of the amplified pulsed laser beam may also be reduced.

Further, operating the amplifiers $310_2$ through $310_n$ disposed downstream from the optical shutter 304 at the weak excitation during the burst rest periods TR may lead to energy savings, while nonetheless retaining the pulse energy of the amplified pulsed laser beam relatively stable.

6.4 Timing Chart

Waveforms of various signals and the pulsed laser beam in the laser apparatus 3A, as shown in FIG. 22, will be described with reference to the drawings below. The operation described with reference to the waveforms shown in FIGS. 4 through 10 in the description of the laser apparatus 3 (FIG. 3) may be similar to that in the laser apparatus 3A and therefore a detailed description thereof will be omitted here. However, the open signals S8 and the close signals S9 for the optical shutter 303, as shown in FIG. 8, may be inputted to the optical shutter 304.

Figure 23:
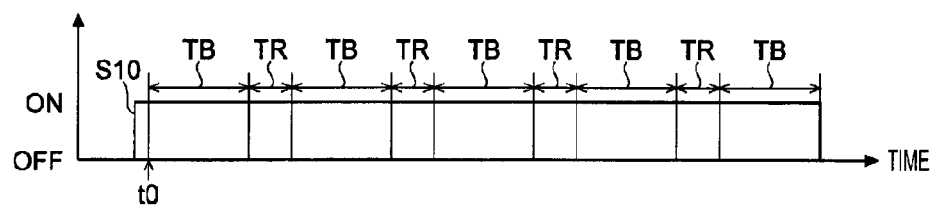
FIG. 23 is a timing chart showing excitation signals which a laser controller may input to a regenerative amplifier.

FIG. 23 is a timing chart showing an excitation signal S10 which the laser controller 301 may input to the regenerative amplifier 310R. As shown in FIG. 23, the excitation signal S10 may be inputted to the regenerative amplifier 310R for causing the regenerative amplifier 310R to operate during a period for which the pulsed laser beam is outputted from the master oscillator 302A, regardless of whether it is during the burst period TB or the burst rest period TR.

Figure 24:
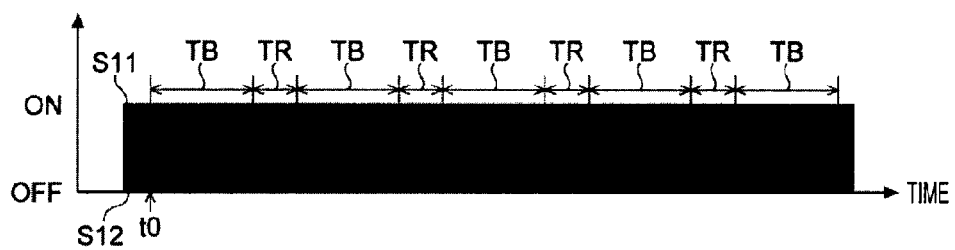
FIG. 24 is a timing chart showing open signals and close signals which a laser controller may input to an optical shutter.

FIG. 24 is a timing chart showing open signals S11 and close signals S12 which the laser controller 301 may input to the optical shutter 303. As shown in FIG. 24, a set of a single open signal S11 and a single close signal S12 may be inputted to the optical shutter 303, which is disposed between the master oscillator 302A the regenerative amplifier 310R, for switching the optical shutter 303 in synchronization with the timing at which a single pulse of the pulsed laser beam passes therethrough. With this, a returning laser beam traveling toward the master oscillator 302A from the regenerative amplifier 310R may be reduced.

Figure 25:
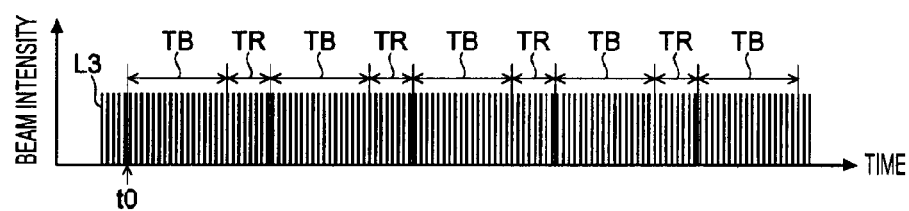
FIG. 25 is a timing chart showing a pulsed laser beam outputted from a regenerative amplifier.

FIG. 25 is a timing chart showing the pulsed laser beam outputted from the regenerative amplifier 310R. As shown in FIGS. 9, 23, and 24, the pulsed laser beam L1, which has passed through the optical shutter 303, may be inputted to the regenerative amplifier 310R continually at a predetermined repetition rate. At the same time, the excitation signal S10 may be inputted to the regenerative amplifier 310R. Accordingly, as shown in FIG. 25, an amplified pulsed laser beam L3 may be outputted from the regenerative amplifier 310R continually at the predetermined repetition rate.

7. Extreme Ultraviolet Light Generation System Including Laser Apparatus

Figure 26:
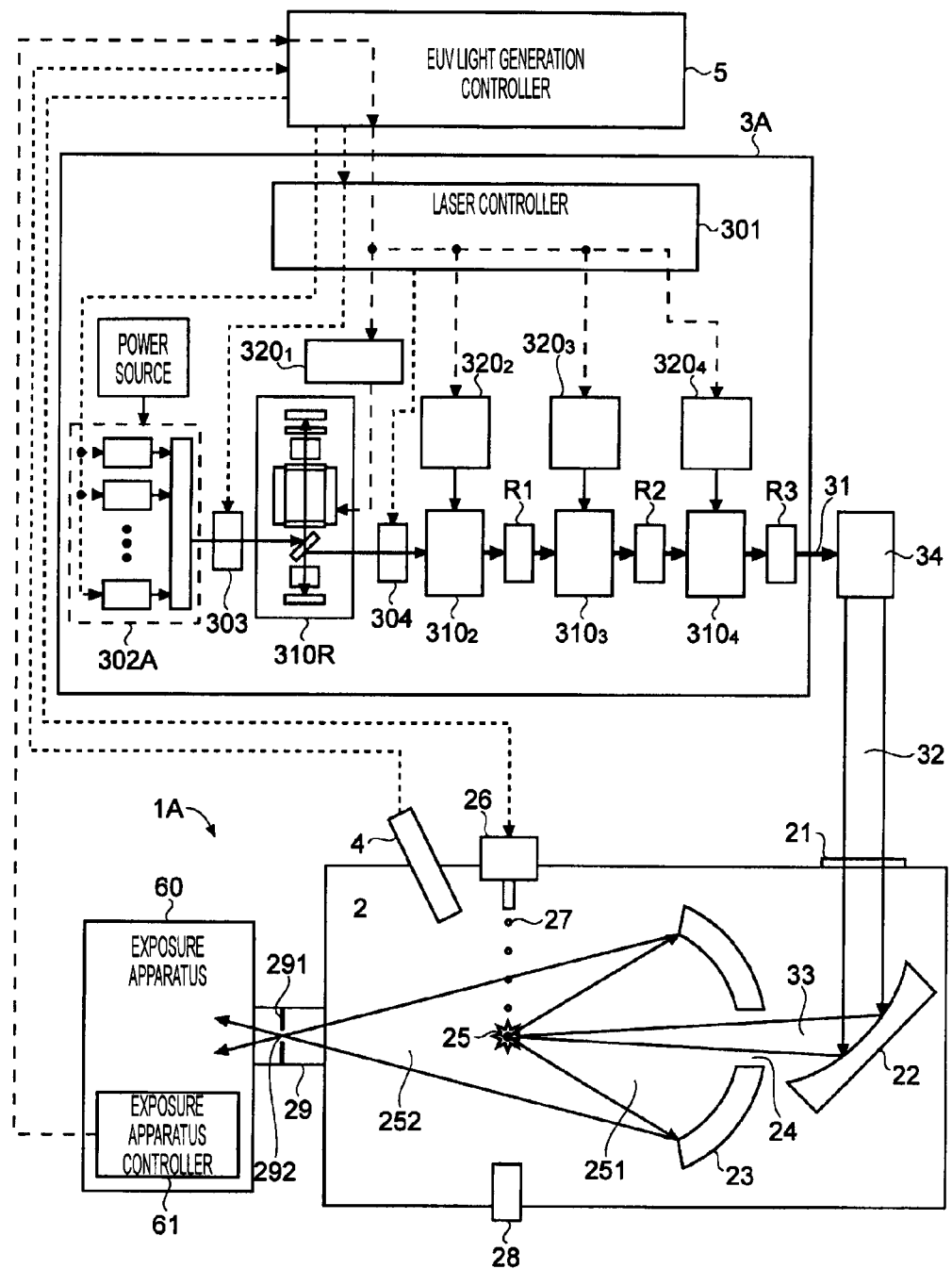
FIG. 26 schematically illustrates the configuration of an EUV light generation system including the laser apparatus shown in FIG. 22.

FIG. 26 schematically illustrates the configuration of an EUV light generation system 11A that includes the laser apparatus 3A, as shown in and described above with reference to FIG. 22.

7.1 Configuration

The EUV light generation system 11A may be used with an exposure apparatus 60 which includes the exposure apparatus controller 61. The EUV light generation system 11A may include the laser apparatus 3A, the EUV light generation controller 5, the droplet generator 26, the target sensor 4, and the chamber 2, as generally described above with reference to FIGS. 3 and 22.

The exposure apparatus controller 61 may be communicably connected to the EUV light generation controller 5. In turn, the EUV light generation controller 5 may be communicably connected to the laser controller 301. The laser apparatus 3A may be similar in configuration to that shown in FIG. 22. Here, however, the laser apparatus 3A may include three amplifiers $310_2$ through $310_4$. Relay optical systems R1 through R3 may be provided downstream from the respective amplifiers $310_2$ through $310_4$.

7.2 Operation

The operation of the EUV light generation system 11A shown in FIG. 26 will now be discussed. Upon receiving the burst permission signal S1 or the burst prohibition signal S2 from the exposure apparatus controller 61, the EUV light generation controller 5 may transmit the burst permission signal S1 or the burst prohibition signal S2 to the laser controller 301.

Further, in starting to generate the pulsed laser beam, the EUV light generation controller 5 may input the oscillation triggers 55 to the semiconductor lasers $302_1$ through $302_n$ for making the semiconductor lasers $302_1$ through $302_n$ oscillate such that the target 27 is irradiated by the pulsed laser beam 33 in the plasma generation region 25. The oscillation triggers S5 may be inputted to the semiconductor lasers $302_1$ through $302_n$ through the laser controller 301. The oscillation triggers S5 may be inputted at a predetermined repetition rate.

The EUV light generation controller 5 may correct, if necessary, the timing at which the oscillation triggers S5 for causing the semiconductor lasers $302_1$ through $302_n$ to oscillate are outputted in accordance with the timing at which the target 27 passing through a given point is detected by the target sensor 4. The EUV light generation controller 5 may send the oscillation triggers S5, whose timing has been corrected as necessary, to the semiconductor lasers $302_1$ through $302_n$ through the laser controller 301. One of the reasons for correcting the timing of the oscillation triggers S5 in accordance with the passing timing of the target 27 is that there is a possibility that the passing timing of the target 27 may shift slightly from the predetermined repetition rate. According to one or more embodiments, adjusting the timing at which the pulsed laser beams are outputted from the semiconductor lasers $302_1$ through $302_n$ in accordance with the shift in the timing of the target 27 may allow the targets 27 to be irradiated by the pulsed laser beam 33 more reliably in the plasma generation region 25.

Further, the EUV light generation controller 5 may output the burst ON signal S3 at a timing delayed from the rise of the burst permission signal S1 by the predetermined time Ts. The burst ON signal S3 may be inputted to the optical shutter 304 through the laser controller 301.

7.3 Effect

In the laser apparatus 3A as described thus far, the semiconductor lasers $302_1$ through $302_n$ may be configured to oscillate continually at a predetermined repetition rate, and the regenerative amplifier 310R may be configured to operate continually. Accordingly, fluctuations in heat loads on the semiconductor lasers $302_1$ through $302_n$ and on the regenerative amplifier 310R may be relatively stable. As a result, the pulsed laser beam may be outputted relatively stably from the regenerative amplifier 310R.

The RF power sources $320_2$ through $320_4$ of the respective amplifiers $310_2$ through $310_4$ disposed downstream from the optical shutter 304 may control the excitation intensity of the amplifiers $310_2$ through $310_4$ to the weak excitation during a period from the start of the burst rest period TR to the rise of the burst permission signal S1. As can be appreciated, the energy consumption during this period may therefore be reduced.

Further, the EUV light generation controller 5 may, after standing by for the predetermined time Ts after the rise of the burst permission signal S1, output the burst ON signal S3. With this, the target 27 may be irradiated by the pulsed laser beam 33 in the plasma generation region 25. Accordingly, each of the targets 27 may be irradiated by the pulsed laser beam 33 with stable pulse energy. As a result, energy stability of the EUV light 252 may be improved, and the debris generated as the target 27 is irradiated by the pulsed laser beam 33 may be reduced.

7.4 Control Flow

The operation of the laser controller 301 shown in FIG. 26 will now be discussed.

Figure 27:
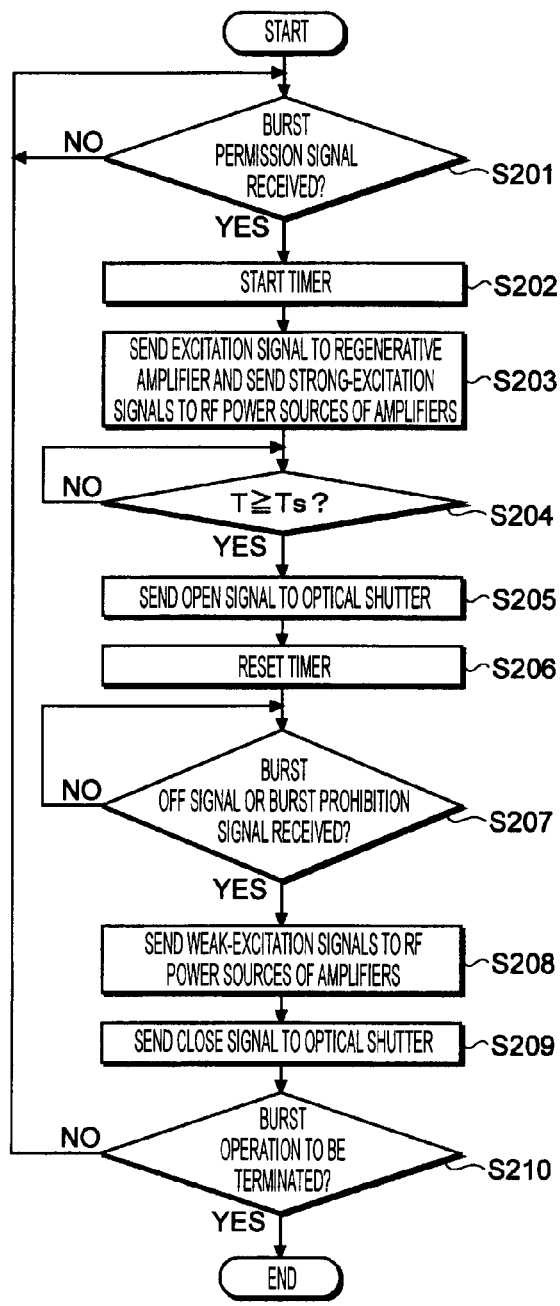
FIG. 27 is a flowchart showing an operation of a laser controller.

7.4.1 Burst Signal Generation Control Flow in EUV Light Generation Controller FIG. 27 is a flowchart showing the operation of the laser controller 301. As shown in FIG. 27, the laser controller 301 may be configured to stand by until it receives the burst permission signal S1 (see FIG. 4) from the exposure apparatus controller 61 through the EUV light generation controller 5 (Step S201; NO). Upon receiving the burst permission signal S1 (Step S201; YES), the laser controller 301 may be configured to start the counter of a timer (not shown) (Step S202). Then, the laser controller 301 may be configured to input the excitation signal S10 (see FIG. 23) and the excitation signals S6 (see FIG. 7) to the RF power sources $320_1$ through $320_4$ of the regenerative amplifier 310R and of the amplifiers $310_2$ through $310_4$ (Step S203).

Subsequently, the laser controller 301 may be configured to stand by until a count value T of the timer reaches or exceeds the time Ts (Step S204; NO). When the count value T reaches or exceeds the predetermined time Ts (Step S204; YES), the laser controller 301 may be configured to send the open signal S8 (see FIG. 8) to the optical shutter 304 (Step S205), and then may be configured to reset the timer (Step S206).

At this point, the laser controller 301 may be configured to stand by until it receives the burst off signal S4 (see FIG. 5) or the burst prohibition signal S2 (see FIG. 4) from the EUV light generation controller 5 (Step S207; NO). Upon receiving the burst off signal S4 or the burst prohibition signal S2 (Step S207; YES), the laser controller 301 may be configured to switch the voltage to be inputted to the RF power sources $320_2$ through $320_4$ of the respective amplifiers $310_2$ through $310_4$ to the voltage specified by the weak-excitation signal S7 (see FIG. 7) (Step S208). Further, the laser controller 301 may be configured to input the close signal S9 (see FIG. 8) to the optical shutter 304 for closing the optical shutter 304 (Step S209).

Thereafter, the laser controller 301 may be configured to determine whether or not the burst operation is to be terminated based on the signal from the exposure apparatus controller 61 (Step S210). When the burst operation is to be terminated (Step S210; YES), this operation may be ended. On the other hand, when the burst operation is to be continued (Step S210; NO), the laser controller 301 may be configured to return to Step S201 and repeat the subsequent steps.

Figure 28:
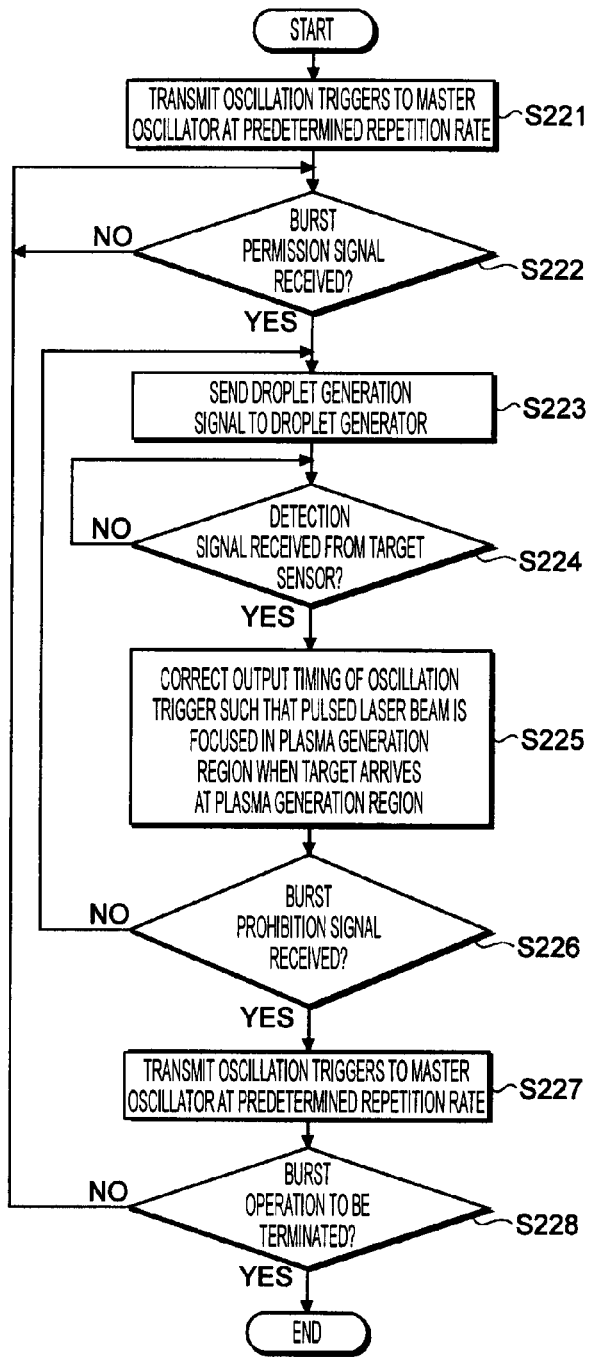
FIG. 28 is a flowchart showing the operation of an EUV light generation controller causing a master oscillator to generate a pulsed laser beam.

7.4.2 Trigger Signal Generation Control Flow in EUV Light Generation Controller The laser controller 301 may cause the master oscillator 302A to output the pulsed laser beam at a predetermined repetition rate, in parallel with the operation shown in FIG. 27. FIG. 28 is a flowchart showing the operation of the laser controller 301 causing the master oscillator 302A to output the pulsed laser beam. As shown in FIG. 28, the laser controller 301 may be configured to send the oscillation triggers S5 (see FIG. 22) to the master oscillator 302A at a predetermined repetition rate (Step S221). With this, the pulsed laser beam L1 (see FIG. 9) may be outputted from the master oscillator 302A at the predetermined repetition rate.

Then, the EUV light generation controller 5 may be configured to stand by until it receives the burst permission signal S1 (see FIG. 5) (Step S222; NO). Upon receiving the burst permission signal S1 (Step S222; YES), the EUV light generation controller 5 may be configured to send droplet generation signals to the droplet generator 26 for causing the droplet generator 26 to generate the targets 27 at a predetermined repetition rate (Step S223). At this point, the transmission of the droplet generation signals at the predetermined repetition rate may be continued until the EUV light generation controller 5 receives the burst prohibition signal S2 (see FIG. 4).

Subsequently, the EUV light generation controller 5 may be configured to stand by until it receives a detection signal of the target 27 from the target sensor 4 (Step S224; NO). Upon receiving the detection signal of the target 27 (Step S224; YES), the EUV light generation controller 5 may correct, if necessary, the timing at which the oscillation trigger S5 is outputted such that the pulsed laser beam 33 is focused in the plasma generation region 25 in synchronization with the timing at which the target 27 reaches the plasma generation region 25, and transmit the corrected oscillation trigger S5 to the master oscillator 302A (Step S225). In other words, in this example, the pulsed laser beam may be outputted on-demand in synchronization with the timing at which the target 27 is outputted. In one or more embodiments, the oscillation triggers S5 do not necessarily have to be outputted at the predetermined repetition rate.

Then, the EUV light generation controller 5 may be configured to determine whether or not it has received the burst prohibition signal S2 (Step S226). When the EUV light generation controller 5 has not received the burst prohibition signal S2 (Step S226; NO), the EUV light generation controller 5 may be configured to return to Step S223, and may then be configured to control the generation of a subsequent target 27 and the output of the pulsed laser beam (Steps S223 through S225). On the other hand, when the EUV light generation controller 5 has received the burst prohibition signal S2 (see FIG. 4) (Step S226; YES), the EUV light generation controller 5 may again send the oscillation triggers S5 (see FIG. 6) to the master oscillator 302A at a predetermined repetition rate (Step S227). Here, the oscillation triggers S5 at the predetermined repetition rate do not need to be in synchronization with the timing at which the targets 27 are outputted. With this, the pulsed laser beam L1 (see FIG. 9) may be outputted from the master oscillator 302A at the predetermined repetition rate.

Thereafter, the EUV light generation controller 5 may be configured to determine whether or not the burst operation is to be terminated based on the signal from the exposure apparatus controller 61 (Step S228). When the burst operation is to be terminated (Step S228; YES), this operation may be ended. On the other hand, when the burst operation is to be continued (Step S228; NO), the EUV light generation controller 5 may be configured to return to Step S222 and repeat the subsequent steps.

Figure 30:
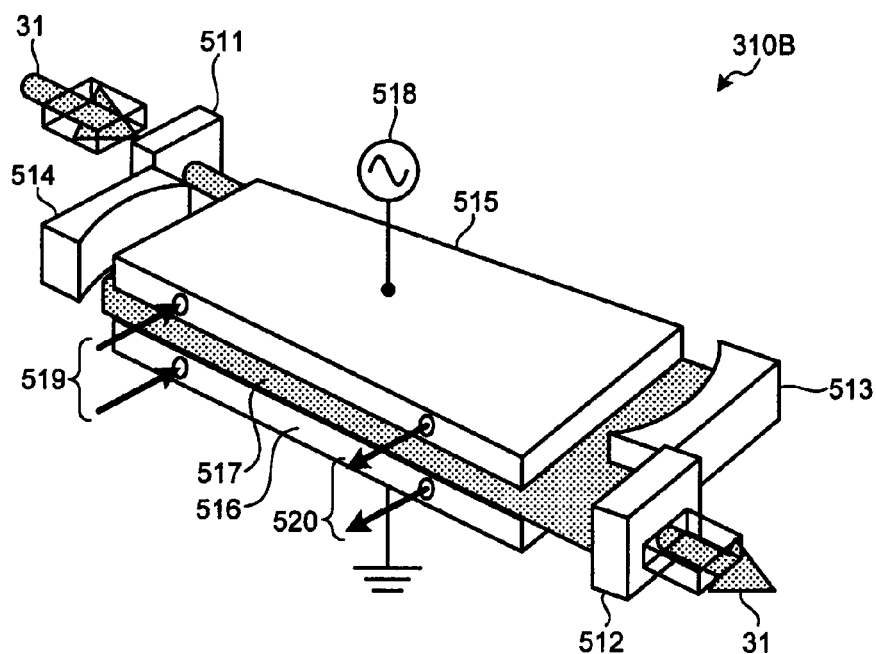
FIG. 30 schematically illustrates the configuration of a slab amplifier.
Figure 31:
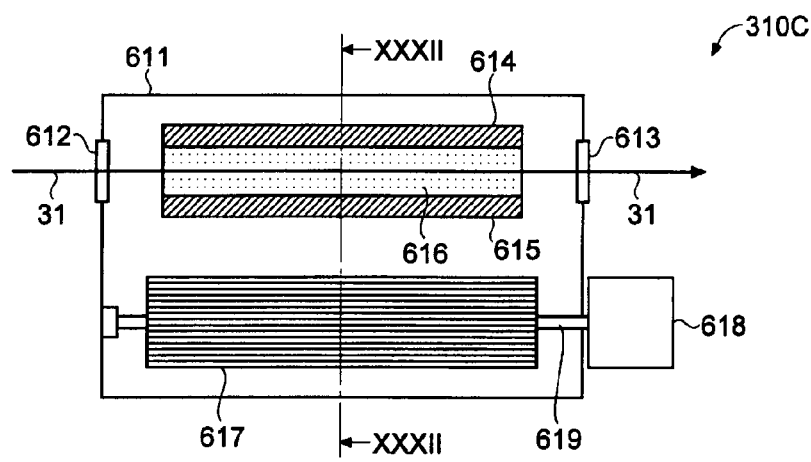
FIG. 31 schematically illustrates the configuration of a three-axis-orthogonal type amplifier.
Figure 32:
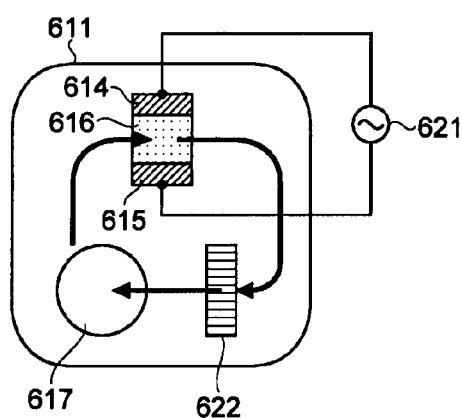
FIG. 32 is a sectional view of the three-axis-orthogonal type amplifier shown in FIG. 31, taken along lines XXXII-XXXII.

8. Supplementary Descriptions
8.1 Configuration of Amplifiers with $CO_2$ Gas as Gain Medium Examples of the amplifiers $310_1$ through $310_n$ in this disclosure will be described below. In the description to follow, amplifiers which contain $CO_2$ gas as a gain medium will be illustrated. Such amplifiers may include a fast-axial-flow amplifier, as shown in FIG. 29, a slab amplifier, as shown in FIG. 30, a triaxial-orthogonal type amplifier, as shown in FIGS. 31 and 32, and so forth.

Fast-Axial-Flow Amplifier

Figure 29:
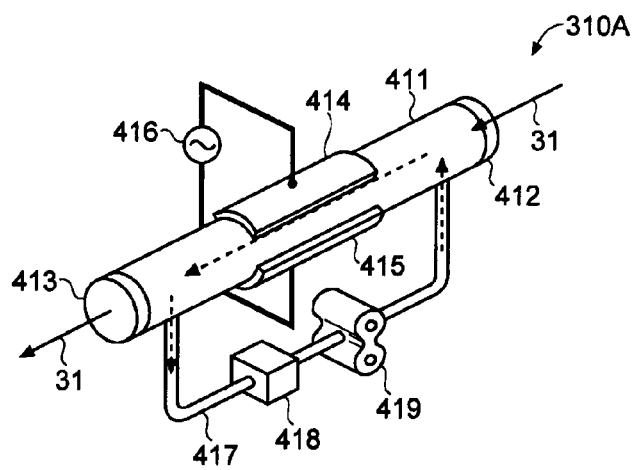
FIG. 29 schematically illustrates the configuration of a fast-axial-flow amplifier.

FIG. 29 schematically illustrates an exemplary configuration of a fast-axial-flow amplifier 310A. As shown in FIG. 29, the fast-axial-flow amplifier 310A may include a discharge tube 411, an input window 412, an output window 413, electrodes 414 and 415, an RF power source 416, a gas tube 417, a heat exchanger 418, and a blower 419. The pulsed laser beam 31 to be amplified may enter the fast-axial-flow amplifier 310A through the input window 412, travel through the discharge tube 411, and be outputted through the output window 413. A gaseous gain medium may circulate within the discharge tube 411 using at least the gas tube 417 and the blower 419. An RF voltage may be applied between the electrodes 414 and 415, which are arranged with the discharge tube 411 and sandwiched therebetween by the RF power source 416. The electrodes 414 and 415 may be configured to excite the gain medium inside the discharge tube 411, thereby amplifying the pulsed laser beam 31 traveling through the discharge tube 411. Heat that may be accumulated in the gain medium by the discharge may be removed by the heat exchanger 418 disposed on the gas tube 417.

Slab Amplifier

FIG. 30 schematically illustrates the configuration of a slab amplifier 310B. An outer housing (sealed container) of the slab amplifier 310B is omitted in order to show the internal configuration thereof. As shown in FIG. 30, the slab amplifier 310B may include an input window 511, discharge electrodes 515 and 516 disposed so as to face each other, spherical concave mirrors 513 and 514, and an output window 512. The discharge electrode 516 may be grounded, and an RF voltage may be applied between the discharge electrodes 515 and 516 from an RF power source 518. The space between the discharge electrodes 515 and 516 may be filled with a gaseous gain medium, which, when the RF voltage is applied between the discharge electrodes 515 and 516, may form a discharge region 517. In the discharge region 517, the gain medium may be excited by the corresponding discharge. The pulsed laser beam 31 may enter the slab amplifier 310B through the input window 511. The spherical concave mirrors 513 and 514 may reflect the pulsed laser beam 31 such that the reflected pulsed laser beam 31 may travel back and forth through the discharge region 517. The pulsed laser beam may be amplified as it travels through the discharge region 517. Thereafter, the amplified pulsed laser beam 31 may be outputted through the output window 512. Flow channels (now shown) may be formed in the respective discharge electrodes 515 and 516. The flow channels may be configured to circulate a cooling medium 519 supplied from a cooling device (not shown) and thereby removing heat accumulated in the discharge electrodes 515 and 516 by the discharge. After adequately cooling the discharge electrodes 515 and 516, the heated and spent cooling medium 519 may flow out of the discharge electrodes 515 and 516 as waste water 520.

Triaxial-Orthogonal Type Amplifier

FIG. 31 schematically illustrates the configuration of a triaxial-orthogonal type amplifier 310C. FIG. 32 is a sectional view of the triaxial-orthogonal type amplifier 310C shown in FIG. 31, taken along lines XXXII-XXXII. As shown in FIGS. 31 and 32, the triaxial-orthogonal type amplifier 310C may include a chamber 611, an input window 612, an output window 613, electrodes 614 and 615 disposed so as to face each other, a cross flow fan 617, and a heat exchanger 622. The chamber 611 may be filled with a gaseous gain medium. The electrodes 614 and 615 may be connected to an RF power source 621 and an RF voltage may be applied between the electrodes 614 and 615 from the RF power source 621, whereby the gain medium between the electrodes 614 and 615 may be excited and an amplification region 616 may be generated therein. The pulsed laser beam 31 that has entered the triaxial-orthogonal type amplifier 310C through the input window 612 may be amplified as it passes through the amplification region 616 between the electrodes 614 and 615, and thereafter be outputted through the output window 613. The cross flow fan 617 may be connected to a motor 618 via a rotational shaft 619 provided either inside or outside the chamber 611. Rotating the cross flow fan 617 by actuating the motor 618 may circulate the gain medium inside the chamber 611. Heat accumulated in the gain medium by the discharge process may be removed by the heat exchanger 622 as the gain medium passes through the heat exchanger 622 fluidly coupled thereto.

8.2 Optical Shutters

Figure 35:
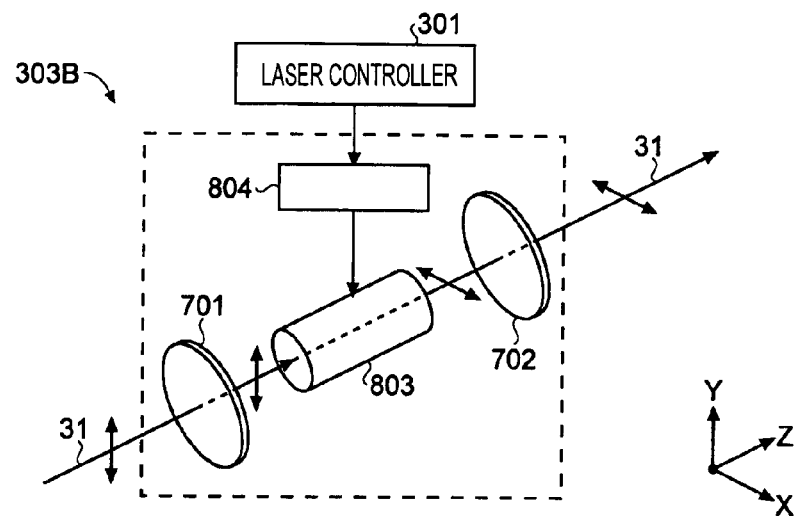
FIG. 35 illustrates an example of an optical shutter including two polarizers and a Faraday rotator.
Figure 36:
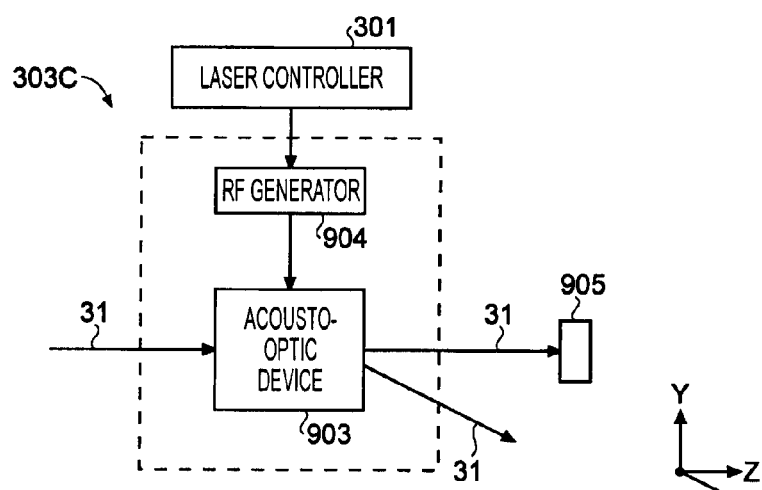
FIG. 36 illustrates an example of an optical shutter configured for use with an acousto-optic device.

Examples of the optical shutter will be illustrated and described below with reference to FIGS. 33, 35, and 36. Specifically, the optical shutter may include an optical shutter 303A, as shown in FIG. 33, where a Pockels cell is combined with polarizers, an optical shutter 303B, as shown in FIG. 35, where a Faraday rotator is combined with polarizers, and an optical shutter 303C, as shown in FIG. 36, where an acousto-optic device is used.

8.2.1 Combination of Pockels Cell and Polarizers

Figure 33:
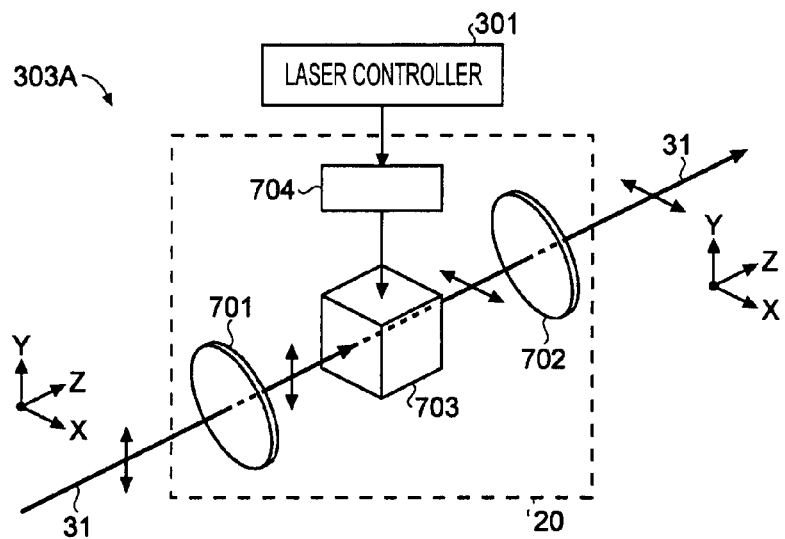
FIG. 33 illustrates an example of an optical shutter including two polarizers and a Pockels cell.

FIG. 33 schematically illustrates the configuration of the optical shutter 303A.

In the configuration shown in FIG. 33, a polarizer 701 may be arranged so as to transmit, of the pulsed laser beam 31 incident thereon, a Y-polarization component and block an X-polarization component. Moreover, a polarizer 702 may be arranged so as to transmit, of the pulsed laser beam 31 incident thereon, the X-polarization component and block the Y-polarization component. In this way, the polarizers 701 and 702 may be arranged so as to transmit different polarization components. In this example, the polarization direction of the pulsed laser beam transmitted through the polarizer 701 may differ by 90 degrees from the polarization direction of the pulsed laser beam transmitted through the polarizer 702.

In exemplary operation, a high-voltage pulse may be applied to a Pockels cell 703 by a high-voltage power source 704, under the control of the laser controller 301. The Pockels cell 703 may be configured to rotate the polarization direction of the pulsed laser beam traveling therethrough while the high-voltage pulse is applied thereto. In the illustrated embodiment, a high-voltage pulse at a voltage level configured to change the polarization direction of the traveling laser beam by 90 degrees may be applied to the Pockels cell 703 by the high-voltage power source 704.

The pulsed laser beam 31 entering the optical shutter 303A may first be incident on the polarizer 701. The polarizer 701 may transmit, of the pulsed laser beam 31 incident thereon, a linearly polarized component in the Y-direction (hereinafter, referred to as the Y-linearly polarized pulsed laser beam). The Y-linearly polarized pulsed laser beam transmitted through the polarizer 701 may then enter the Pockels cell 703.

When the high-voltage pulse is not being applied to the Pockels cell 703, the Y-linearly polarized pulsed laser beam entering the Pockels cell 703 may be outputted from the Pockels cell 703 while being retained as the Y-linearly polarized pulsed laser beam. The outputted Y-linearly polarized pulsed laser beam may then be incident on the polarizer 702, and the polarizer 702 may either reflect or absorb the Y-linearly polarized pulsed laser beam incident thereon. As a result, the pulsed laser beam 31 may be blocked by the optical shutter 303A.

On the other hand, when the high-voltage pulse is applied to the Pockels cell 703, the polarization direction of the Y-linearly polarized pulsed laser beam entering the Pockels cell 703 may be rotated by 90 degrees. As a result, a linearly polarized pulsed laser beam in the X-direction (hereinafter, referred to as the X-linearly polarized pulsed laser beam) may be outputted from the Pockels cell 703. The outputted X-linearly polarized pulsed laser beam may then be incident on the polarizer 702 which may transmit the X-linearly polarized pulsed laser beam incident thereon. As a result, the pulsed laser beam 31 may be outputted from the optical shutter 303A. As a result, the pulsed laser beam 31 outputted from the optical shutter 303A is converted into a Y-linearly polarized pulsed laser beam which may then enter an amplifier (not shown) disposed downstream therefrom.

In some embodiments, the high-voltage pulse may be applied to the Pockels cell 703 in synchronization with the timing at which each pulse of the pulsed laser beam 31 reaches the Pockels cell 703, and the application of the high-voltage pulse may be stopped in synchronization with the timing at which each pulse of the pulsed laser beam 31 is outputted from the Pockels cell 703. As a result, a self-oscillation laser beam or a returning laser beam from downstream-side amplifiers may be suppressed by the optical shutter 303A. Further, stopping the application of the high-voltage pulses to the Pockels cell 703 during the burst rest period TR may allow the pulsed laser beam 31 to be outputted in burst. That is, the optical shutter 303A may be configured to fulfill the functions of both suppressing the self-oscillation laser beam or the returning laser beam and putting a laser apparatus in the burst operation mode.

Figure 34:
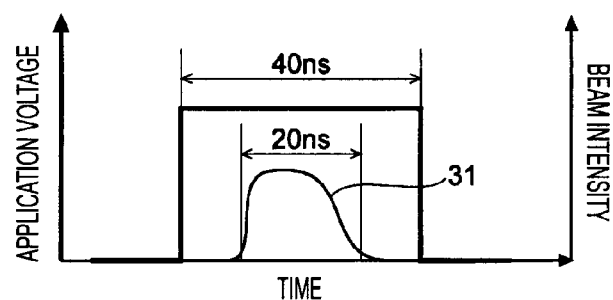
FIG. 34 shows the relationship between a single pulse of a pulsed laser beam and the operation of an optical shutter.

As shown in FIG. 34, when, for example, a duration (pulse width) of a single pulse of the pulsed laser beam 31 is 20 ns, preferably a high-voltage pulse with such duration (for example, 40 ns) that can absorb some timing jitter of the pulsed laser beam 31 may be applied to the Pockels cell 703 of the optical shutter 303A. Here, when the duration of the high-voltage pulse is too long, the returning laser beam may not be suppressed in some cases. Accordingly, the duration of the high-voltage pulse may preferably be set appropriately. A Pockels cell typically has a responsiveness of a few nanoseconds; thus, it may be suitable for an optical shutter in a laser apparatus where high-speed switching is required.

The optical shutter 303A of this example may be configured such that the polarization direction of the pulsed laser beam transmitted through the polarizer 701 and the polarization direction of the pulsed laser beam transmitted through the polarizer 702 differ by 90 degrees. Accordingly, the optical shutter 303A may transmit the pulsed laser beam 31 while the high-voltage pulse is being applied to the Pockels cell 703. It will be appreciated, however, that this disclosure is not limited thereto. For example, the configuration may be such that the polarization direction of the pulsed laser beam transmitted through the polarizer 701 and the polarization direction of the pulsed laser beam transmitted through the polarizer 702 are the same. In this case, the optical shutter 303A may transmit the pulsed laser beam 31 while the high-voltage pulse is not being applied to the Pockels cell 703.

8.2.2 Combination of Faraday Rotator and Polarizers

FIG. 35 schematically illustrates the configuration of the optical shutter 303B which includes the polarizers 701 and 702 and a Faraday rotator 803.

As shown in FIG. 35, in the optical shutter 303B, the Pockels cell 703 and the high-voltage power source 704 in the optical shutter 303A may be replaced by the Faraday rotator 803 and a magnetic field generation source 804, respectively. Other configurations may be similar to those of the optical shutter 303A.

In operation, a magnetic field may be generated inside the Faraday rotator 803 by the magnetic field generation source 804, under the control of the laser controller 301. The Faraday rotator 803 may be configured to rotate the polarization direction of the pulsed laser beam 31 entering the Faraday rotator 803 while the magnetic field is generated thereinside, for example. In this example, a magnetic field of such intensity that may rotate the polarization direction of an entering pulsed laser beam by 90 degrees may be generated inside the Faraday rotator 803 by the magnetic field generation source 804.

In this way, using the Faraday rotator 803 in place of the Pockels cell 703 may also make it possible to achieve the optical shutter 303B that fulfills the functions of both suppressing the self-oscillation laser beam or the returning laser beam and putting a laser apparatus in the burst operation mode, as in the optical shutter 303A.

8.2.3 Acousto-Optic Device

FIG. 36 schematically illustrates an exemplary configuration of the optical shutter 303C which includes an acousto-optic device 903.

A radio-frequency (RF) signal may be inputted to the acousto-optic device 903 by an RF generator 904, under the control of the laser controller 301. The acousto-optic device 903 may be configured to change the direction into which a pulsed laser beam entering the acousto-optic device 903 is outputted while the RF signal is being applied thereto, for example. Accordingly, in this example, an amplifier arranged downstream from the optical shutter 303C may be configured to receive the pulsed laser beam 31 outputted while the RF signal is being inputted to the acousto-optic device 903. In one or more embodiments, the direction into which the pulsed laser beam 31 is to be outputted while the RF signal is being applied to the acousto-optic device 903 may be the direction into which the pulsed laser beam 31 is outputted from the laser apparatus 303C.

In this way, using the acousto-optic device 903 may also make it possible to achieve the optical shutter 303C that fulfills the functions of both suppressing the self-oscillation laser beam or the returning laser beam and putting a laser apparatus in the burst operation mode, as in the optical shutter 303A. Here, a beam dump 905 or the like for absorbing the pulsed laser beam 31 may preferably be disposed in the direction into which the pulsed laser beam 31 is to be outputted from the acousto-optic device 903 while the RF signal is not being inputted to the acousto-optic device 903. Alternatively, the placement of the downstream-side amplifier and the beam dump 905 may be switched. In this case, the optical shutter 303C may be open while the RF signal is not being inputted to the acousto-optic device 903.

8.2.4 Variations of Optical Shutters

The optical shutter in which the polarizers and the Pockels cell are combined may also be modified as follows.

8.2.4.1 First Variation

Figure 37:
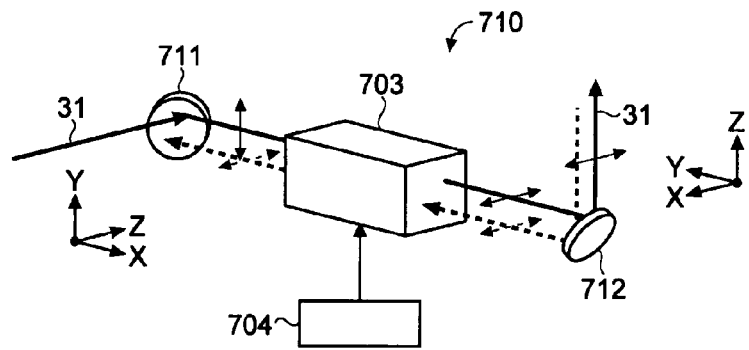
FIG. 37 schematically illustrates a first variation of an optical shutter.

FIG. 37 schematically illustrates the configuration of another exemplary optical shutter 710. In the optical shutter 710, reflective polarizers (hereinafter, simply referred to as mirrors) 711 and 712 may be used in place of the transmissive polarizers 701 and 702, for example. In one or more embodiments, the mirrors 711 and 712 may be absorbing thin-film reflectors (ATFR), or the like. Even with such a configuration, similar functions to those of the optical shutter 303A shown in FIG. 33 may be achieved. In FIG. 37, the high-voltage power source 704 is omitted.

8.2.4.2 Second Variation

Figure 38:
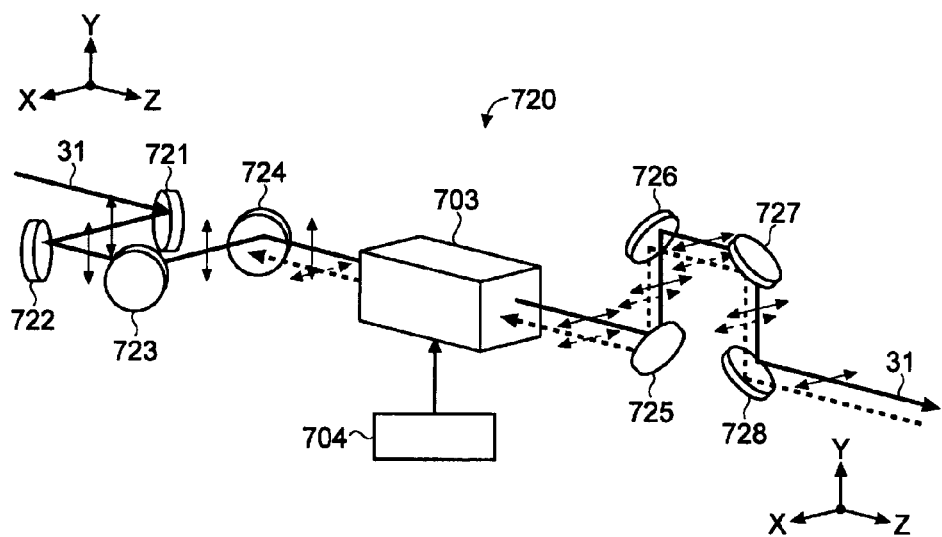
FIG. 38 schematically illustrates a second variation of an optical shutter.

FIG. 38 schematically illustrates the configuration of another exemplary optical shutter 720. The optical shutter 720 may include four mirrors 721, 722, 723, and 724 arranged upstream from the Pockels cell 703. Further, four mirrors 725, 726, 727, and 728 may be arranged downstream from the Pockels cell 703. The mirrors 721 through 728 may respectively be ATFRS, or the like. In some embodiments, the mirrors 721 through 724 arranged upstream from the Pockels cell 703 may reflect, of the pulsed laser beam 31 incident thereon, a polarization component in the vertical direction and absorb the other polarization component. Meanwhile, the mirrors 725 through 728 arranged downstream from the Pockels cell 703 may reflect, of the pulsed laser beam 31 incident thereon, a polarization component in the horizontal direction and absorb the other polarization component. Accordingly, a plurality of mirrors may be arranged respectively upstream and downstream from the Pockels cell 703 so as to reflect one polarization component and absorb another polarization component. With this arrangement, the total absorptivity of an unwanted polarization component may be increased, and the purity of the specific polarization component can likewise be increased. As a result, an unwanted polarization component of the pulsed laser beam 31 may be effectively by the optical shutter 720.

8.2.4.3 Third Variation

Figure 39:
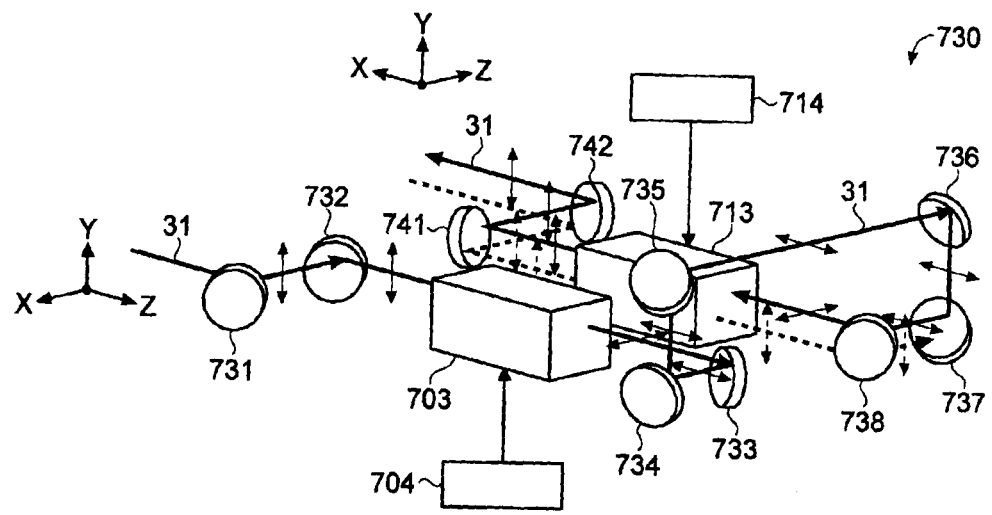
FIG. 39 schematically illustrates a third variation of an optical shutter.

FIG. 39 schematically illustrates the configuration of another exemplary optical shutter 730. As shown in FIG. 39, the optical shutter 730 may include two Pockels cells 703 and 713. The Pockels cell 713 may be similar in configuration to the Pockels cell 703, generally described above. As illustrated, the Pockels cell 703 may be disposed upstream from the Pockels cell 713. Mirrors 731 and 732 disposed upstream from the Pockels cell 703 and mirrors 741 and 742 disposed downstream from the Pockels cell 713 may reflect, of the pulsed laser beam 31 incident thereon, the same polarization component (e.g., a polarization component in the vertical direction) and absorb the other polarization component. Mirrors 734, 735, 736, and 737 may be disposed between the Pockels cells 703 and 713, and may, of the pulsed laser beam 31 incident thereon, reflect the same polarization component (e.g., a polarization component in the horizontal direction) and absorb the other polarization component. High-reflection mirrors 733 and 738 may be disposed respectively downstream from the Pockels cell 703 and upstream from the Pockels cell 713. In this way, when the plurality of the Pockels cells 703 and 713 are used, the total absorptivity of an unwanted polarization component may be increased, whereby the purity of the specific polarization component can be increased. As a result, the unwanted polarization component of the laser beam 31 may be effectively blocked by the optical shutter 730.

8.2.4.4 Fourth Variation

Figure 40:
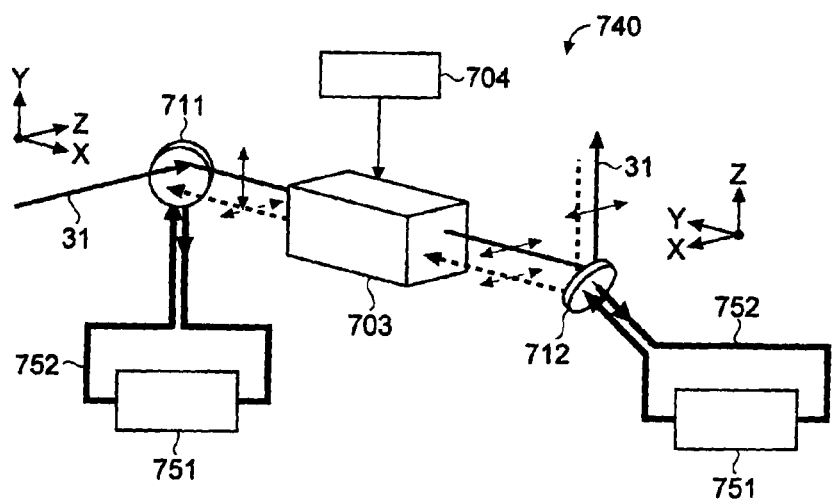
FIG. 40 schematically illustrates a fourth variation of an optical shutter.

FIG. 40 schematically illustrates the configuration of another exemplary optical shutter 740. As shown in FIG. 40, the optical shutter 740 may be similar in configuration to the optical shutter 710, as described with reference to FIG. 37, but may differ in that the mirrors 711 and 712 may each be provided with cooling devices 751. A cooling medium may be supplied from the cooling devices 751 through flow channels 752 into the respective mirrors 711 and 712. Flow channels defined inside the respective mirrors 711 and 712 may be provided such that the cooling medium may flow efficiently behind the respective reflective surfaces. Accordingly, the reflective surfaces of the mirrors 711 and 712 may be cooled efficiently and in a balanced manner, whereby thermal deformation in the respective mirror surfaces may be suppressed. As a result, the direction into which the pulsed laser beam 31 is reflected by the mirror 711 and 712 and the wavefront of the reflected pulsed laser beam 31 may be stabilized. In at least one embodiment, a cooling device (not shown) may also be provided to the Pockels cell 703, whereby overheating in the Pockels cell 703 may be substantially suppressed.

8.3 Regenerative Amplifier

Figure 41:
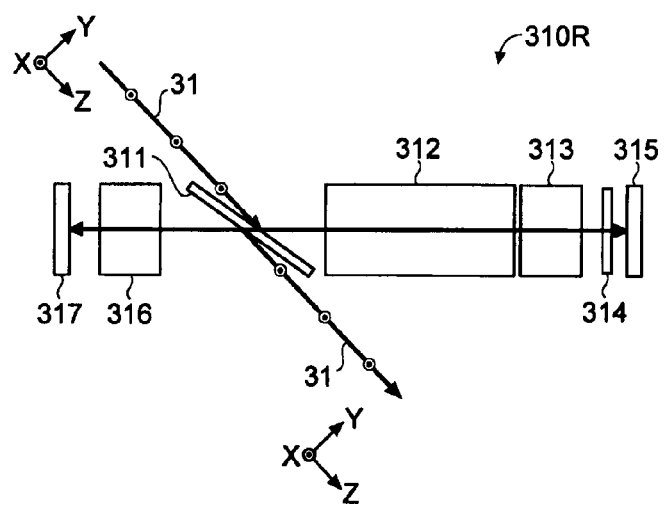
FIG. 41 schematically illustrates an example of a regenerative amplifier.

An example of the regenerative amplifier will be discussed below. FIG. 41 schematically illustrates the configuration of the regenerative amplifier 310R, as generally discussed above with reference to FIG. 22. The regenerative amplifier 310R may include a polarization beam splitter 311, a $CO_2$ gas amplification part 312, Pockels cells 313 and 316, a quarter-wave plate 314, and resonator mirrors 315 and 317.

In one or more embodiments, the polarization beam splitter 311 may be a thin-film polarizer. The polarization beam splitter 311 may be positioned so as to reflect the S-polarization component of a pulsed laser beam 31 incident thereon and transmit the P-polarization component thereof. Specifically, the polarization beam splitter 311 may introduce the S-polarization component of the pulsed laser beam 31 incident thereon into the regenerative amplifier 310R. The direction in which the pulsed laser beam 31 travels is set to be the Z-direction; thus, the pulsed laser beam 31 introduced into the regenerative amplifier 310R may be polarized in the X-direction. The pulsed laser beam 31 introduced into the regenerative amplifier 310R may travel in an optical resonator formed jointly by the resonator mirrors 315 and 317. The pulsed laser beam 31 traveling in the optical resonator may be amplified as it passes through the $CO_2$ gas amplification part 312. The pulsed laser beam 31 may pass through the Pockels cell 313, to which a voltage is not applied. Then, the pulsed laser beam 31 may be transmitted through the quarter-wave plate 314, reflected by the resonator mirror 315, and again be transmitted through the quarter-wave plate 314. Accordingly, upon being reflected by the resonator mirror 315, the polarization direction of the pulsed laser beam 31 may be changed from the X-direction to the Y-direction. Subsequently, the pulsed laser beam 31 may again pass through the Pockels cell 313. A predetermined high-voltage pulse may be applied to the Pockels cell 313 at the timing at which the pulsed laser beam 31 has passed through the Pockels cell 313 for the second time.

The pulsed laser beam 31, which may be incident on the polarization beam splitter 311 as mostly the P-polarization component, may be transmitted through the polarization beam splitter 311, and then may pass through the Pockels cell 316, to which voltage is not applied. The pulsed laser beam 31 may be reflected by the resonator mirror 317 and again pass through the Pockels cell 316. The pulsed laser beam 31, whose polarization direction has not been changed, may then be transmitted back through the polarization beam splitter 311 and again amplified as it passes through the $CO_2$ gas amplification part 312. Thereafter, the pulsed laser beam 31 may enter the Pockels cell 313, to which a voltage is applied. The Pockels cell 313 to which the voltage is applied may be configured to give a quarter-wave phase shift to the pulsed laser beam 31 passing therethrough. Accordingly, the pulsed laser beam 31 may then be transmitted through the quarter-wave plate 314, reflected by the resonator mirror 315, transmitted through the quarter-wave plate 314 again, and subsequently pass through the Pockels cell 313 to which the high voltage is applied. As a result, the polarization direction of the pulsed laser beam 31 may be changed back into the Y-direction. In this way, while the predetermined high voltage pulse is being applied to the Pockels cell 313, the pulsed laser beam 31 may be incident on the polarization beam splitter 311 mostly as the P-polarization component and be transmitted through the polarization beam splitter 311. As a result, the pulsed laser beam 31 may be trapped in the optical resonator.

Thereafter, the predetermined high voltage pulse may be applied to the Pockels cell 316 at a timing at which the pulsed laser beam 31 is to be outputted. The pulsed laser beam 31 traveling back and forth in the optical resonator may be transmitted through the polarization beam splitter 311 and then be subjected to the quarter-wave phase shift when passing through the Pockels cell 316 to which the voltage is applied. With this, the pulsed laser beam 31 may be transformed into a circularly-polarized pulsed laser beam. Thereafter, the circularly-polarized pulsed laser beam 31 may be reflected by the resonator mirror 317 and again pass through the Pockels cell 316 to which the voltage is applied. As a result, the pulsed laser beam 31 may be transformed into a linearly-polarized pulsed laser beam 31 that is polarized in the X-direction. The linearly-polarized pulsed laser beam 31 may then be incident on the polarization beam splitter 311 as mostly the S-polarization component. Accordingly, the pulsed laser beam 31 incident on the polarization beam splitter 311 may be reflected by the polarization beam splitter 311. As a result, the pulsed laser beam 31 may be outputted from the regenerative amplifier 310R in the Z-direction.

The above-described embodiments and the variations thereof are merely examples for implementing this disclosure, and this disclosure is not limited thereto. Making various modifications according to the specifications or the like is within the scope of this disclosure, and it is apparent from the above description that other various embodiments are possible within the scope of this disclosure. For example, the modifications illustrated for particular ones of the embodiments can be applied to other embodiments as well (including the other embodiments described herein).

The terms used in this specification and the appended claims should be interpreted as "non-limiting." For example, the terms "include" and "be included" should be interpreted as "including the stated elements but not being limited to the stated elements." The term "have" should be interpreted as "including the stated elements but not being limited to the stated elements." Further, the modifier "one (a/an)" should be interpreted as "at least one" or "one or more."

What is claimed is:

1. A laser apparatus, comprising:
   a master oscillator configured to output a laser beam;
   at least one amplifier disposed in a beam path of the laser beam from the master oscillator;
   at least one power source for applying a high-frequency voltage to the at least one amplifier; and
   a controller for varying the high-frequency voltage to be applied to the at least one amplifier from the at least one power source,
   wherein the controller is configured to:
     control the high-frequency voltage applied to the at least one amplifier from the at least one power source so that the at least one amplifier is retained at a first excitation intensity during a first period, and
     control the high-frequency voltage applied to the at least one amplifier from the at least one power source so that the at least one amplifier is retained at a second excitation intensity during a second period, and
   the first excitation intensity is above the second excitation intensity.

2. The laser apparatus according to claim 1, wherein
   the laser apparatus is configured to intermittently output a laser beam in bursts,
   the first period is a period from a point prior to a start of a burst period to an end of the burst period, a laser beam being outputted intermittently from the laser apparatus during the burst period, and
   the second period is a period from an end of the burst period to a point prior to a start of a subsequent burst period.

3. The laser apparatus according to claim 1, wherein
   the controller is configured to control the at least one power source such that a duty cycle of the high-frequency voltage to be applied to the at least one amplifier during the second period is smaller than a duty cycle of the high-frequency voltage to be applied to the at least one amplifier during the first period.

4. The laser apparatus according to claim 1, wherein
   the controller is configured to control the at least one power source such that an amplitude of the high-frequency voltage to be applied to the at least one amplifier during the second period is smaller than an amplitude of the high-frequency voltage to be applied to the at least one amplifier during the first period.

5. The laser apparatus according to claim 1, wherein
   the controller is configured to control the at least one power source such that a duty cycle and an amplitude of the high-frequency voltage to be applied to the at least one amplifier during the second period are smaller than a duty cycle and an amplitude of the high-frequency voltage to be applied to the at least one amplifier during the first period.

6. The laser apparatus according to claim 1, further comprising
at least one optical shutter arranged between the master oscillator and the at least one amplifier, wherein
the laser apparatus is configured to intermittently output a laser beam in bursts, and
the controller is configured to:
control the master oscillator to output the laser beam continually,
open the at least one optical shutter during a burst period in which the laser beam is outputted intermittently from the laser apparatus, and
close the at least one optical shutter outside of the burst period.

7. The laser apparatus according to claim 6, wherein
the controller is configured to control a variation of the high-frequency voltage to be applied to the at least one amplifier from the at least one power source in synchronization with a switching of the at least one optical shutter.

8. The laser apparatus according to claim 1, wherein
the at least one amplifier includes a regenerative amplifier.

9. An extreme ultraviolet light generation system, comprising:
the laser apparatus of claim 1;
a chamber;
a target supply unit provided on the chamber; and
an extreme ultraviolet light generation controller configured to control the laser apparatus and the target supply unit.

10. A method for controlling a laser apparatus that includes a master oscillator, at least one amplifier, at least one power source, and a laser controller, the method comprising:
outputting a pulsed laser beam continually at a predetermined repetition rate from the master oscillator; and
varying a high-frequency voltage to be applied to the at least one amplifier from the at least one power source, wherein:
the high-frequency voltage to be applied to the at least one amplifier from the at least one power source is controlled so that the at least one amplifier is retained at a first excitation intensity during a first period,
the high-frequency voltage to be applied to the at least one amplifier from the at least one power source is controlled so that the at least one amplifier is retained at a second excitation intensity during a second period, and the first excitation intensity is above the second excitation intensity.

11. The method according to claim 10, wherein the laser apparatus is configured to intermittently output a laser beam in bursts,
the first period is a period from a point prior to a start of a burst period to an end of the burst period, a laser beam being outputted intermittently from the laser apparatus during the burst period, and
the second period is a period from an end of the burst period to a point prior to a start of a subsequent burst period.

12. The method according to claim 11, wherein
the at least one power source is controlled such that a duty cycle of the high-frequency voltage to be applied to the at least one amplifier during the second period is smaller than a duty cycle of the high-frequency voltage to be applied to the at least one amplifier during the first period.

13. The method according to claim 11, wherein
the at least one power source is controlled such that an amplitude of the high-frequency voltage to be applied to the at least one amplifier during the second period is smaller than an amplitude of the high-frequency voltage to be applied to the at least one amplifier during the first period.

14. The method according to claim 11, wherein
the at least one power source is controlled such that a duty cycle and an amplitude of the high-frequency voltage to be applied to the at least one amplifier during the second period are smaller than a duty cycle and an amplitude of the high-frequency voltage to be applied to the at least one amplifier during the first period.

15. The method according to claim 10, wherein:
the laser apparatus further includes at least one optical shutter arranged between the master oscillator and the at least one amplifier,
the laser apparatus is configured to intermittently output a laser beam in bursts, and
the controller is configured to:
control the master oscillator to output the laser beam continually,
open the at least one optical shutter during a burst period in which the laser beam is outputted intermittently from the laser apparatus, and
close the at least one optical shutter outside of the burst period.

16. The method according to claim 15, wherein
a variation of the high-frequency voltage to be applied to the at least one amplifier from the at least one power source is controlled in synchronization with a switching of the at least one optical shutter.

* * * * *